United States Patent
Inuzuka et al.

(10) Patent No.: US 11,923,862 B2
(45) Date of Patent: Mar. 5, 2024

(54) TRANSMISSION APPARATUS AND TRANSMISSION SYSTEM

(71) Applicant: NIPPON TELEGRAPH AND TELEPHONE CORPORATION, Tokyo (JP)

(72) Inventors: Fumikazu Inuzuka, Musashino (JP); Kei Kitamura, Musashino (JP); Akira Hirano, Musashino (JP); Masahito Tomizawa, Musashino (JP); Takuya Ohara, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 340 days.

(21) Appl. No.: 17/311,646

(22) PCT Filed: Dec. 4, 2019

(86) PCT No.: PCT/JP2019/047326
§ 371 (c)(1),
(2) Date: Jun. 7, 2021

(87) PCT Pub. No.: WO2020/121903
PCT Pub. Date: Jun. 18, 2020

(65) Prior Publication Data
US 2022/0109449 A1    Apr. 7, 2022

(30) Foreign Application Priority Data
Dec. 11, 2018 (JP) ................... 2018-231937

(51) Int. Cl.
*H04B 1/06* (2006.01)
*H03L 7/18* (2006.01)
(Continued)

(52) U.S. Cl.
CPC ................ *H03L 7/18* (2013.01); *H04B 1/04* (2013.01); *H04B 1/06* (2013.01); *H04J 3/062* (2013.01); *H04J 3/14* (2013.01); *H04L 7/0037* (2013.01)

(58) Field of Classification Search
CPC ..................................................... H04B 1/06
See application file for complete search history.

(56) References Cited

U.S. PATENT DOCUMENTS

| 2005/0156645 | A1* | 7/2005 | Hirano | ............. | G11C 27/02 327/233 |
| 2007/0060079 | A1* | 3/2007 | Nakagawa | ............. | G01S 5/06 455/131 |

(Continued)

FOREIGN PATENT DOCUMENTS

| JP | H066382 A | 1/1994 |
| JP | 2012100111 A | 5/2012 |
| JP | 2015019381 A | 1/2015 |

OTHER PUBLICATIONS

Ono, Takashi et al., "Novel ODU Path Switching For ODU Reallocation Without Bit Disruption Using Dynamic Delay Control Scheme", 2011 Optical Fiber Communication Conference And Exposition And the National Fiber Optic Engineers Conference (OFC/NFOEC 2011): Los Angeles, California, USA, Mar. 6-10, 2011, IEEE, Piscataway, NJ, USA, Mar. 6, 2011, pp. 1-3, XP031946115, ISBN: 978-1-4577-0213-6.

*Primary Examiner* — Sibin Chen
(74) *Attorney, Agent, or Firm* — Harness, Dickey & Pierce, P.L.C.

(57) ABSTRACT

A first reception processing unit performs a process of receiving a first signal transmitted on a first transmission line, a second reception processing unit performs a process of receiving a second signal transmitted on a second transmission line, and an output speed control unit controls output speeds of the first signal and the second signal subjected to the reception process. A system switching unit selects and outputs the first signal or the second signal subjected to a reception process, and an output processing unit performs a process for output to another apparatus on the output from the system switching unit. A reception side clock output unit outputs a clock signal giving a processing timing of each process, and a clock frequency control unit adjusts a frequency of the clock signal giving the processing timing to the output processing unit. A frequency adjustment range calculation unit calculates an adjustment range of the (Continued)

frequency based on frequency deviation accuracy of the reception side clock output unit, frequency deviation accuracy of a transmission side clock output unit that outputs a clock signal giving a processing timing to a transmission process at a transmission apparatus on the transmission side, and a prescribed value of a frequency deviation.

8 Claims, 25 Drawing Sheets

(51) Int. Cl.
*H04B 1/04* (2006.01)
*H04J 3/06* (2006.01)
*H04J 3/14* (2006.01)
*H04L 7/00* (2006.01)

(56) References Cited

U.S. PATENT DOCUMENTS

| | | | |
|---|---|---|---|
| 2011/0007625 A1* | 1/2011 | Kataoka | H04L 27/2656 370/208 |
| 2011/0043694 A1* | 2/2011 | Izuno | H04N 21/4392 348/E9.034 |

* cited by examiner

TRANSMISSION APPARATUS AND TRANSMISSION SYSTEM

CROSS-REFERENCE TO RELATED APPLICATIONS

This application is a 371 U.S. National Phase of International Application No. PCT/JP2019/047326 filed on Dec. 4, 2019, which claims priority to Japanese Application No. 2018-231937 filed on Dec. 11, 2018. The entire disclosures of the above applications are incorporated herein by reference.

TECHNICAL FIELD

The present invention relates to a transmission apparatus and a transmission system.

BACKGROUND ART

In order to economically support a rapid increase in data traffic in recent years, a transmission capacity of an optical transmission apparatus in a backbone network has continued to expand. Further, an optical transmission system that transmits a large amount of data traffic over a wide area has a configuration in which a communication path is made redundant for ensuring the reliability of a network. A network is made redundant in an operational system that provides a service and a backup system that serves as a backup for the operational system, such that a highly reliable network in which a path is switched to the backup system for continuity of services when a failure occurs in the operational system can be constructed.

Further, in recent years, in the case of services such as Internet protocol television (IP TV) or video on demand (VoD) with a high real-time demand, or services with high importance such as financial systems, instantaneous interruption of a network due to path switching has caused deterioration of service quality. Thus, there is strong demand for a communication service provider to switch between paths without instantaneous interruption. For example, Patent Literature 1 describes a technique for performing non-instantaneous interruption switching during service provision.

CITATION LIST

Patent Literature

Patent Literature 1: JP2012-100111A

SUMMARY OF THE INVENTION

Technical Problem

A non-instantaneous interruption switching device performs adjustment to absorb a delay difference between a signal transmitted in an active system and a signal transmitted in a backup system before path switching between the active system and the backup system is performed to perform the path switching without instantaneous interruption. In the related art, a non-instantaneous interruption switching device on the reception side intentionally changes a clock frequency of a clock generator mounted in the device within a prescribed clock frequency deviation in order to perform the adjustment. However, in such an adjustment, there may be a case in which a frequency adjustment range must be made as small as possible. When the frequency adjustment range is small, a maintenance operation time required for adjustment for eliminating a delay difference increases with an increase in a delay time difference (path length difference) between the active system and the backup system. The technique described in Patent Literature 1 does not disclose a specific configuration of a clock system and does not solve such a problem.

In view of the above circumstances, an object of the present invention is to provide a transmission apparatus and a transmission system capable of shortening a delay difference adjustment time.

Means for Solving the Problem

An aspect of the present invention is a transmission apparatus for switching to output any one of a first signal received from another transmission apparatus via a first transmission line and a second signal received from the other transmission apparatus via a second transmission line, the transmission apparatus including: a first reception processing unit configured to receive the first signal transmitted on the first transmission line and perform a reception process on the first signal; a second reception processing unit configured to receive the second signal transmitted on the second transmission line and perform a reception process on the second signal; an output speed control unit configured to control a speed at which the first signal on which the first reception processing unit has performed the reception process is output and a speed at which the second signal on which the second reception processing unit has performed the reception process is output; a system switching unit configured to select and output any one of the first signal output by the first reception processing unit and the second signal output by the second reception processing unit; an output processing unit configured to perform an output process for outputting the first signal or the second signal output by the system switching unit to another apparatus; a reception side clock output unit configured to output a clock signal giving a processing timing to each of the first reception processing unit, the second reception processing unit, and the output processing unit; a clock frequency control unit configured to adjust a frequency of the clock signal giving the processing timing to the output processing unit; and a frequency adjustment range calculation unit configured to calculate an adjustment range of the frequency at the clock frequency control unit based on frequency deviation accuracy of the reception side clock output unit, frequency deviation accuracy of a transmission side clock output unit that outputs a clock signal giving a processing timing to a process of transmitting the first signal and a process of transmitting the second signal at the other transmission apparatus, and a prescribed value of a frequency deviation.

An aspect of the present invention is the transmission apparatus described above, wherein the reception process includes line side signal processing for reception of a signal from a line side, the output process includes client side signal processing for outputting a received signal to a client side, and the transmission apparatus includes a line side signal processing unit configured to perform the line side signal processing of the first reception processing unit and the line side signal processing of the second reception processing unit; and a client side signal processing unit configured to perform the client side signal processing of the output processing unit.

An aspect of the present invention is the transmission apparatus described above, including: a line unit; a client unit; and a main board to or from which the line unit and the client unit can be attached or detached, wherein the line unit includes the line side signal processing unit, the client unit includes the client side signal processing unit, the output speed control unit, the system switching unit, the output processing unit, the clock frequency control unit, and the frequency adjustment range calculation unit, and the main board includes a part of the reception side clock output unit.

An aspect of the present invention is the transmission apparatus described above, including the client side signal processing unit having a redundant configuration.

An aspect of the present invention is the transmission apparatus described above, wherein the frequency adjustment range calculation unit acquires the frequency deviation accuracy measured at the transmission apparatus and the frequency deviation accuracy measured at the other transmission apparatus.

An aspect of the present invention is the transmission apparatus described above, wherein the system switching unit measures a delay difference between the first signal and the second signal, and the frequency adjustment range calculation unit calculates the adjustment range for eliminating the delay difference within a maintenance operation time based on the measured delay difference and the input maintenance operation time.

An aspect of the present invention is the transmission apparatus described above, further including: a system switching control unit configured to select any one of a system of the first transmission line and a system of the second transmission line and instruct the system switching unit to select the first signal or the second signal received in the selected system, wherein the clock frequency control unit includes: a frequency divider configured to divide the clock signal giving a processing timing to the output processing unit and adjust a frequency; and a clock adjustment unit configured to control a frequency division ratio, the frequency divider using the frequency division ratio for frequency division.

An aspect of the present invention is a transmission system including a transmission apparatus on the transmission side and a transmission apparatus on the reception side connected by a first transmission line and a second transmission line, wherein the transmission apparatus on the transmission side includes a transmission processing unit that performs a process of transmitting a first signal transmitted via the first transmission line and a process of transmitting a second signal having the same content as the first signal transmitted on the second transmission line; and a transmission side clock output unit configured to output a transmission side clock signal giving a processing timing to the transmission process, and the transmission apparatus on the reception side includes a first reception processing unit configured to receive the first signal transmitted on the first transmission line and perform a reception process on the first signal; a second reception processing unit configured to receive the second signal transmitted on the second transmission line and perform a reception process on the second signal; an output speed control unit configured to control a speed at which the first signal on which the first reception processing unit has performed the reception process is output and a speed at which the second signal on which the second reception processing unit has performed the reception process is output; a system switching unit configured to select and output any one of the first signal output by the first reception processing unit and the second signal output by the second reception processing unit; an output processing unit configured to perform an output process for outputting the first signal or the second signal output by the system switching unit to another apparatus; a reception side clock output unit configured to output a reception side clock signal giving a processing timing to each of the first reception processing unit, the second reception processing unit, and the output processing unit; a clock frequency control unit configured to adjust a frequency of the reception side clock signal giving the processing timing to the output processing unit; and a frequency adjustment range calculation unit configured to calculate an adjustment range of the frequency at the clock frequency control unit based on frequency deviation accuracy of the reception side clock output unit, frequency deviation accuracy of the transmission side clock output unit, and a prescribed value of a frequency deviation.

Effects of the Invention

According to the present invention, it is possible to shorten the delay difference adjustment time.

DESCRIPTION OF EMBODIMENTS

Figure 1:
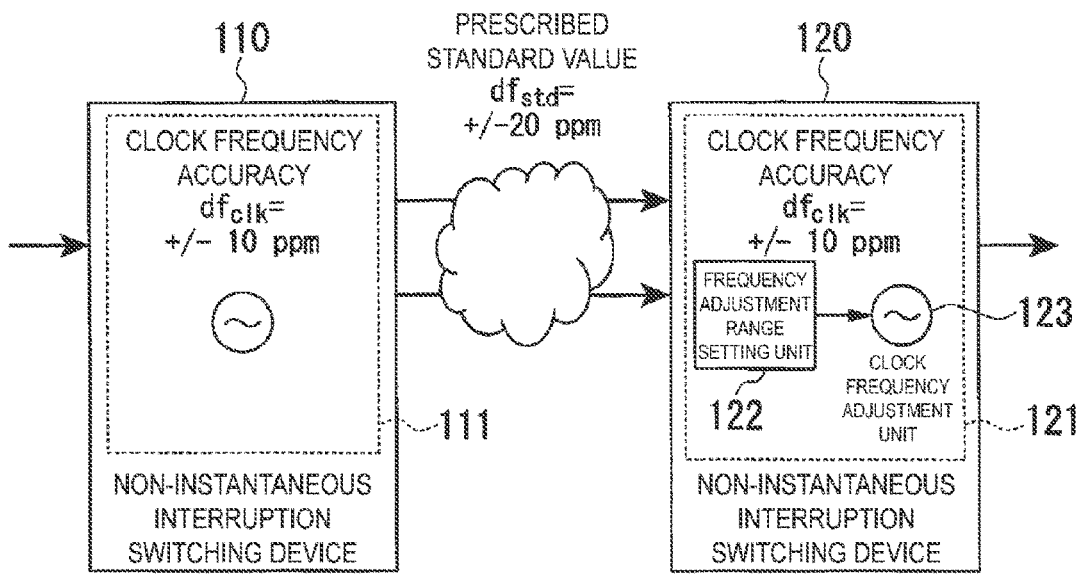
FIG. 1 is a diagram illustrating a clock frequency accuracy at a non-instantaneous interruption switching device according to an embodiment of the present invention.

Hereinafter, embodiments of the present invention will be described in detail with reference to the drawings.
A non-instantaneous interruption switching device and a transmission system using the non-instantaneous interruption switching device of the present embodiment provide a communication service in which the occurrence of communication interruption is prevented, reliability is high, and a network failure rate is low in order to increase a tolerance against a network failure in the transmission system. In the present embodiment, a case in which a transmission system is an optical transport network (OTN), which is an example of an optical transmission system, and a non-instantaneous interruption switching device is an optical transmission apparatus of the OTN will be described by way of example.

The non-instantaneous interruption switching device and the transmission system of the present embodiment determine a maximum clock frequency deviation adjustment range based on a difference between a prescribed value of the frequency deviation and a frequency deviation value of a clock generator included in each of the non-instantaneous interruption switching devices on the transmission and reception sides. The non-instantaneous interruption switching device on the reception side adjusts a clock frequency according to this maximum clock frequency deviation adjustment range to eliminate a delay difference, thereby shortening a delay difference adjustment time regarding non-instantaneous interruption switching of an ODU path as much as possible. Further, the non-instantaneous interruption switching device and the transmission system of the present embodiment determine a clock frequency deviation adjustment range of each of the non-instantaneous interruption switching devices on the transmission side and the reception side so that the clock frequency deviation adjustment range is equal to or smaller than the prescribed value of the frequency deviation and fits within a desired clock frequency adjustment time.

Because a non-instantaneous interruption switching device of the related art uses only a clock frequency deviation on the reception side and does not take a clock frequency deviation on the transmission side into account, there may be a case in which a clock frequency adjustment range must be narrowed. Further, in the related art described in Patent Literature 1, a configuration regarding a specific clock system on the transmission side and the reception side is not described, and it may be difficult to realize a device configuration that takes a fault tolerance against an in-device failure including the clock system into account.

Thus, the non-instantaneous interruption switching device and the transmission system of the present embodiment realize the following.

(1) The accuracy of the clock generator of the non-instantaneous interruption switching device on the transmission side, in addition to the accuracy of the clock generator of the non-instantaneous interruption switching device on the reception side, is determined such that the clock frequency adjustment range is widened. Thus, a delay difference adjustment time regarding the non-instantaneous interruption switching of the ODU path is shortened. (2) The clock frequency deviation in each of the non-instantaneous interruption switching devices on the transmission side and the reception side is detected and an optimum clock frequency adjustment range is derived, thereby further enhancing the effect of (1). (3) A device configuration unit is divided in units of input and output interfaces (IFs) on the transmission side and the reception side, thereby improving a fault tolerance with respect to a device failure.

Here, a relationship between a clock frequency accuracy of the clock generator in the apparatus and an adjustment range of the clock frequency will be described.

Figure 2:
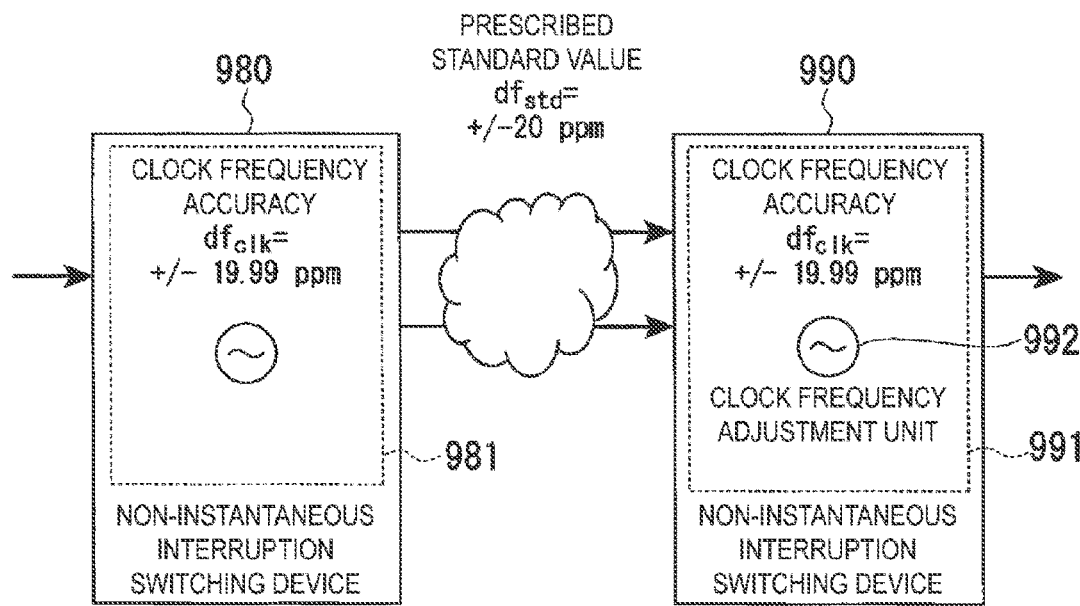
FIG. 2 is a diagram illustrating clock frequency accuracy at a non-instantaneous interruption switching device of the related art.

FIG. 1 is a diagram illustrating the clock frequency accuracy of the non-instantaneous interruption switching devices 110 and 120 of the present embodiment, and FIG. 2 is a diagram illustrating the clock frequency accuracy of the non-instantaneous interruption switching devices 980 and 990 to which the related art is applied. A prescribed standard value $df_{std}$ indicates a maximum value of the clock frequency deviation (variation) defined according to a standard for maintenance of quality. As an example, the prescribed standard value $df_{std}$ is +/−20 ppm. +/−X ppm indicates a range from −X ppm to +X ppm.

The non-instantaneous interruption switching devices 110 and 980 on the transmission side include transmission units 111 and 981, respectively, and the non-instantaneous interruption switching devices 120 and 990 on the reception side include reception units 121 and 991, respectively. One non-instantaneous interruption switching device may include the transmission unit 111 and the reception unit 121, or the transmission unit 981 and the reception unit 991.

The transmission units 111 and 981 transmit the same signal to the transmission line of the active system and the transmission line of the backup system. Hereinafter, a signal transmitted on the transmission line of the active system will be described as a first signal, and a signal transmitted on the transmission line of the backup system will be described as a second signal. The reception units 121 and 991 receive the first signal transmitted on the transmission line of the active system and the second signal transmitted on the transmission line of the backup system. In general, the transmission line of the active system has a shorter distance than the transmission line of the backup system. Thus, the first signal often arrives at the non-instantaneous interruption switching devices 120 and 990 on the reception side earlier than the second signal. The non-instantaneous interruption switching devices 120 and 990 on the reception side output data received from the first signal to the communication apparatus in a subsequent stage.

Path switching includes planned path switching and path switching due to a failure. In the planned path switching, a delay difference between the first signal and the second signal in the non-instantaneous interruption switching devices 120 and 990 on the reception side is adjusted before the switching according to an instruction that a maintenance person has input using the maintenance operational system or the like or an instruction automatically given by the maintenance operational system or the like. After the delay difference is eliminated, the maintenance person instructs the non-instantaneous interruption switching devices 120 and 990 on the reception side to perform switching from the active system to the backup system. After switching, the non-instantaneous interruption switching devices 120 and 990 on the reception side output the data included in the second signal to the communication apparatus in the subsequent stage.

On the other hand, when path switching due to a failure is performed without an instantaneous interruption, the non-instantaneous interruption switching devices 120 and 990 on the reception side adjust the delay difference between the first signal and the second signal and then, put the transmission system into an operating state. Thus, even when a failure occurs in the active system, the non-instantaneous interruption switching devices 120 and 990 on the reception side can perform switching to the backup system without instantaneous interruption. The present embodiment can be applied to any of a delay difference adjustment before the planned path switching and a delay difference adjustment for performing the non-instantaneous interruption switching at the time of a failure.

The non-instantaneous interruption switching device 120 specifically performs the delay difference adjustment as follows. First, the non-instantaneous interruption switching device 120 buffers the first signal in a first buffer and the second signal in a second buffer. The first buffer and the second buffer are First In First Out (FIFO) buffers. Normally, in the first signal and the second signal in which the same data has been set, the first signal having a shorter path length early arrives at the non-instantaneous interruption switching device 120 on the reception side first and is buffered. The non-instantaneous interruption switching device 120 selects a signal of the system in operation from the first signal read from the first buffer and the second signal read from the second buffer, and outputs the signal to a subsequent stage. The non-instantaneous interruption switching device 120 decreases the clock frequency of the clock signal that is used as a reference clock for the reading of the first buffer and the second buffer and a process of outputting the first signal or the second signal that have been read, in a range in which the resultant clock frequency fits within the prescribed standard value. The non-instantaneous interruption switching device 120 may increase the clock frequency of the clock signal that is used as the reference clock in a range in which the resultant clock frequency fits within the prescribed standard value.

The non-instantaneous interruption switching device 120 monitors the number of pieces of write data and the number of pieces of read data in the first buffer and the number of pieces of write data and the number of pieces of read data in the second buffer, and decreases a reading speed of the first buffer according to the reference clock. The non-instantaneous interruption switching device 120 may increase a reading speed of the second buffer. Thus, the amount of data of the first signal read from the first buffer within the same time becomes smaller than the amount of data read from the second buffer. Eventually, timings at which the first signal and the second signal in which the same data has been set are output from the first buffer and the second buffer become the same, and the delay difference is eliminated.

In the related art, because a specific realization configuration regarding the clock frequency deviation is not specified, a clock generator having a clock frequency accuracy within a prescribed standard value can be used for the non-instantaneous interruption switching devices 980 and 990 illustrated in FIG. 2. For example, a clock generator having a clock frequency accuracy $df_{clk}$ of +/−19.99 ppm can be used in each of the transmission unit 981 of the non-instantaneous interruption switching device 980 and the reception unit 991 of the non-instantaneous interruption switching device 990. In this case, a range in which the clock frequency can be adjusted in the clock frequency adjustment unit 992 of the reception unit 991 is $df_{std}-df_{clk}=+/-0.01$ ppm.

It is assumed that a 100G signal, for example, is transmitted and received between the non-instantaneous interruption switching device 980 on the transmission side and the non-instantaneous interruption switching device 990 on the reception side, and a 1,000 km delay difference is present between the transmission line of the active system and the transmission line of the backup system. Because a transmission speed of an optical signal transmitted on an optical fiber is 200,000 [km/s], a clock adjustment time required to eliminate the delay difference is 500,000 seconds=(100 [Gbps]×1,000 [km]/200,000 [km/s])/(100 [Gpbs]×0.01 ppm). This means that, when planned switching is performed, the path switching cannot be performed until 500,000 seconds elapses after the maintenance person instructs the delay difference adjustment.

On the other hand, the reception unit 121 of the non-instantaneous interruption switching device 120 illustrated in FIG. 1 includes a frequency adjustment range setting unit 122 that determines a frequency adjustment range based on a difference between the prescribed standard value and the clock frequency accuracy of the clock generator included in each of the non-instantaneous interruption switching devices 110 and 120.

Each of the transmission unit 111 of the non-instantaneous interruption switching device 110 and the reception unit 121 of the non-instantaneous interruption switching device 120 uses a clock generator having a clock frequency accuracy $df_{clk}$ of 30 /31 10 ppm.

In this case, the frequency adjustment range setting unit 122 sets the range in which the clock frequency can be adjusted in the clock frequency adjustment unit 123 of the reception unit 121, to $df_{std}-df_{clk}=+/-10$ ppm. It is assumed that a 100G signal is transmitted and received between the non-instantaneous interruption switching device 110 on the transmission side and the non-instantaneous interruption switching device 120 on the reception side, and a 1,000 km delay difference is present between the transmission line of the active system and the transmission line of the backup system, as in FIG. 2. In this case, the clock adjustment time is 500 seconds=(100 [Gbps]×1,000 [km]/200,000 [km/s])/(100 [Gpbs]×10 ppm).

As described above, highly accurate clock generators are used for the non-instantaneous interruption switching devices 110 and 120 of the present embodiment and the clock frequency accuracy of the clock generators is ascertained, such that a maximum range in which the clock frequency can be adjusted can be determined and the delay difference adjustment time can be shortened.

Detailed embodiments will be described below.

FIRST EMBODIMENT

Figure 3:
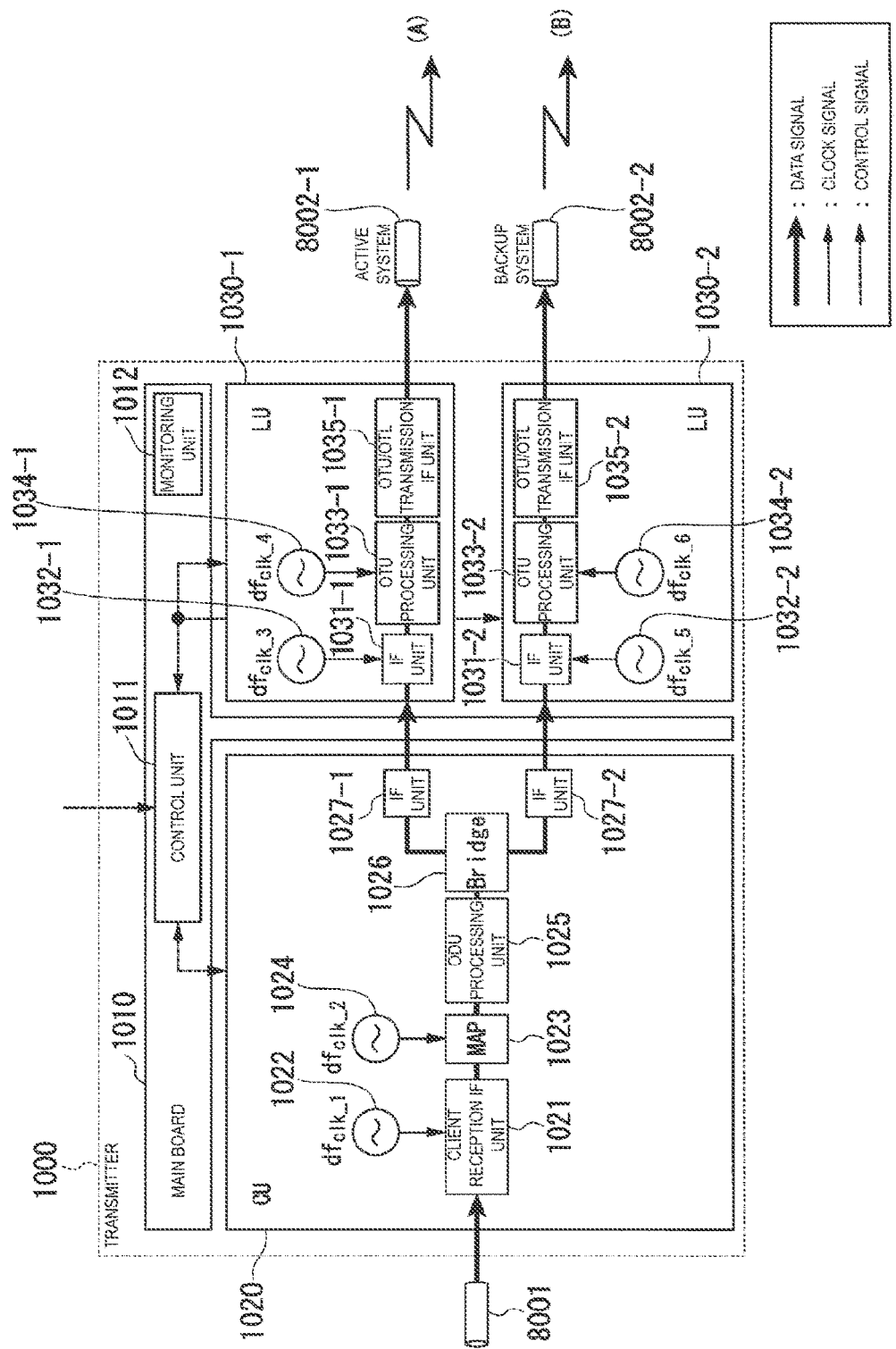
FIG. 3 is a configuration diagram of a transmitter according to a first embodiment.
Figure 4:
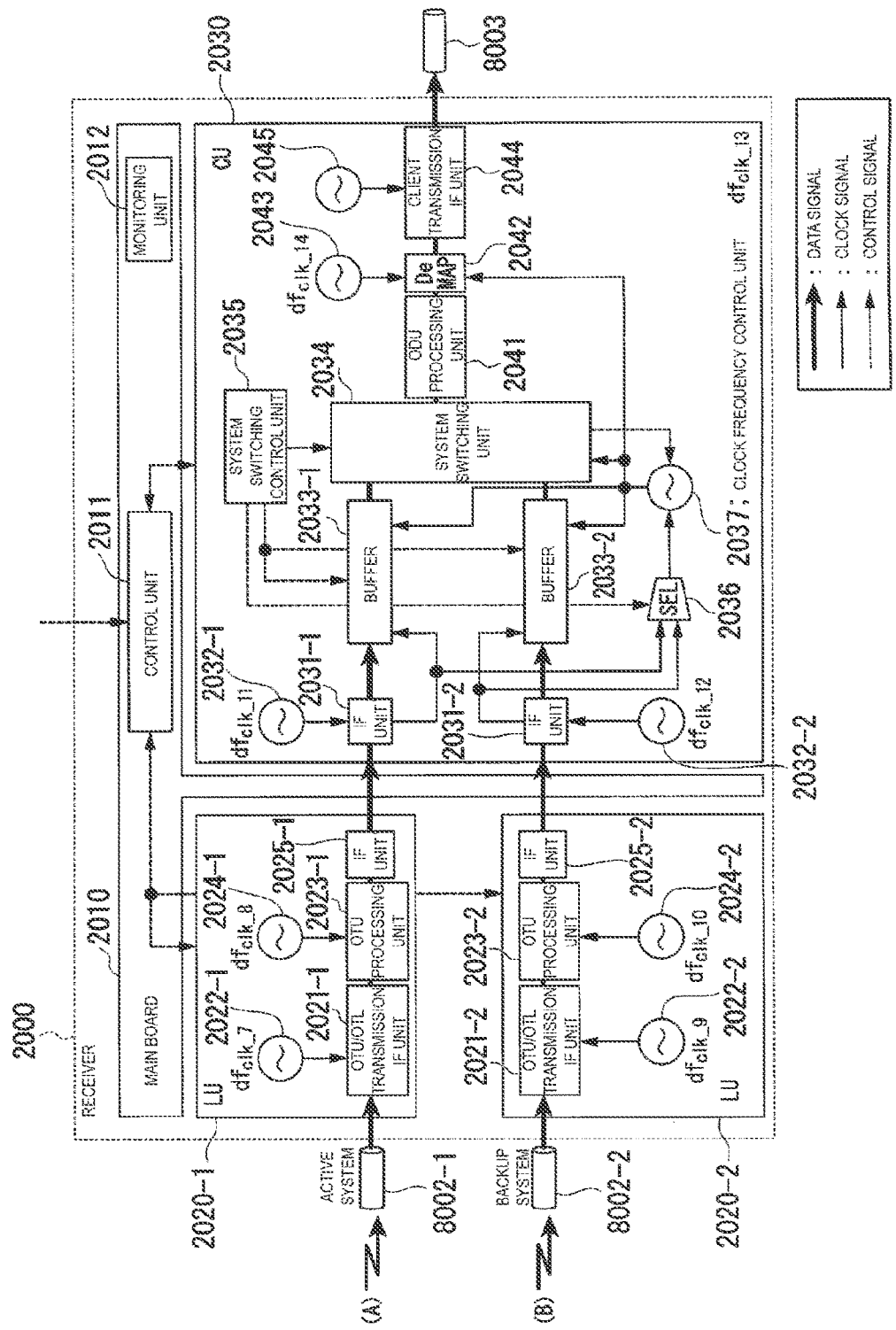
FIG. 4 is a configuration diagram of a receiver according to the first embodiment.

FIG. 3 is a configuration diagram of a transmitter 1000 according to the present embodiment, and FIG. 4 is a configuration diagram of a receiver 2000 according to the present embodiment. The transmitter 1000 and the receiver 2000 are optical transmission apparatuses constituting an OTN. The transmitter 1000 is connected to the receiver 2000 via two transmission lines 8002. Among the two transmission lines 8002, an active system is described as a transmission line 8002-1 and a backup system is described as a transmission line 8002-2. The transmission line 8002 may be provided with a transmission apparatus that amplifies and relays a signal transmitted by the transmission line 8002.

A configuration of the transmitter 1000 will be described with reference to FIG. 3. The transmitter 1000 includes a main board 1010, a client unit (hereinafter referred to as a "CU" or "client processor") 1020, and two line units (hereinafter referred to as an "LU" or "line processor") 1030. The transmitter 1000 has a pluggable configuration. That is, the CU 1020 and the LU 1030 are units that can be attached to and detached from the main board 1010. Hereinafter, the LU 1030 connected to the transmission line 8002-$i$ ($i$=1, 2) will be described as an LU 1030-$i$.

The main board 1010 includes a control unit 1011 and a monitoring unit 1012. The control unit 1011 controls the CU 1020 and the LU 1030. The monitoring unit 1012 monitors the CU 1020 and the LU 1030 and performs, for example, detection of the occurrence of a failure.

The CU 1020 includes a client reception IF unit 1021, a clock generator 1022, a mapping unit (MAP) 1023, a clock generator 1024, an ODU processing unit 1025, a bridge 1026, and IF units 1027-1 and 1027-2.

The client reception IF unit 1021 receives a client signal transmitted on the transmission line 8001 according to a timing of a clock signal output from the clock generator 1022. The mapping unit 1023 maps the client signal input from the client reception IF unit 1021 to a payload of an optical channel data unit (ODU) 4 frame. The mapping unit 1023 outputs the ODU4 frame according to a timing of a clock signal output from the clock generator 1024. The ODU processing unit 1025 adds an overhead (OH) to the ODU4 frame in which the client signal has been set. Because the transmitter 1000 transmits the 100 G signal, an extended MFAS is set in the OH in addition to a multiframe element signal (MFAS). A reserve area of the OH is used to set the extended MFAS. A matrix representing the reserve area used by the extended MFAS is also set in the OH. The bridge 1026 outputs the ODU4 frame output by the ODU processing unit 1025 to the IF unit 1027-1 and the IF unit 1027-2. The IF unit 1027-$i$ ($i$=1, 2) outputs the ODU4 frame to the LU 1030-$i$.

The LU 1030-$i$ ($i$=1, 2) includes an IF unit 1031-$i$, a clock generator 1032-$i$, an OTU processing unit 1033-$i$, a clock generator 1034-$i$, and an OTU/OTL transmission IF unit 1035-$i$. The IF unit 1031-$i$ receives the ODU4 frame output from the CU 1020 according to a timing of a clock signal output from the clock generator 1032-$i$. The OTU processing unit 1033-$i$ multiplexes the ODU4 frames received by the IF unit 1031-$i$ to generate an OTU4 frame, and outputs the OTU4 frame to the OTU/OTL transmission IF unit 1035-$i$ according to a timing of a clock signal output by the clock generator 1034-$i$. The OTU/OTL transmission IF unit 1035-$i$ divides the OTU4 signal into an optical channel transport line (OTL) signal of a 100G signal, converts the OTL signal to an optical signal, and outputs the optical signal to the transmission line 8002-$i$.

A configuration of the receiver 2000 will be described with reference to FIG. 4. The receiver 2000 includes a main board 2010, two LUs 2020, and a CU 2030. The receiver 2000 has a pluggable configuration. That is, the LU 2020 and the CU 2030 are units that can be attached to and detached from the main board 2010. Hereinafter, the LU 2020 connected to the transmission line 8002-$i$ ($i$=1, 2) will be described as an LU 2020-$i$.

The main board 2010 includes a control unit 2011 and a monitoring unit 2012. The control unit 2011 controls the LU 2020 and the CU 2030. The monitoring unit 2012 monitors the LU 2020 and CU 2030 and performs, for example, detection of the occurrence of a failure.

The LU 2020-$i$ ($i$=1, 2) includes an OTU/OTL reception IF unit 2021-$i$, a clock generator 2022-$i$, an OTU processing unit 2023-$i$, a clock generator 2024-$i$, and an IF unit 2025-$i$. The OTU/OTL reception IF unit 2021-$i$ receives an optical signal transmitted on the transmission line 8002-$i$ according to a timing of a clock signal output from the clock generator 2022-$i$, and converts the received optical signal to an OTL signal which is an electrical signal. The OTU/OTL reception IF unit 2021-$i$ restores the OTU4 frame from the OTL signal and outputs the OTU4 frame to the OTU processing unit 2023-$i$. The OTU processing unit 2023-$i$ performs a process of receiving the OTU4 frame and restores the frame signal in which the ODU frames are multiplexed. The OTU processing unit 2023-$i$ outputs the restored frame signal to the IF unit 2025-$i$ according to a timing of a clock signal output from the clock generator 2024-$i$. The IF unit 2025-$i$ outputs the frame signal to the CU 2030.

The CU 2030 includes IF units 2031-1 and 2031-2, clock generators 2032-1 and 2032-2, buffers 2033-1 and 2033-2, a system switching unit 2034, a system switching control unit 2035, a selector unit (SEL) 2036, a clock frequency control unit 2037, an ODU processing unit 2041, a demapping unit (DeMAP) 2042, a clock generator 2043, a client transmission IF unit 2044, and a clock generator 2045.

An IF unit 2031-$i$ ($i$=1, 2) receives a frame signal output by the LU 2020-$i$ according to a timing of a clock signal output from the clock generator 2032-$i$. The IF unit 2031-$i$ outputs the received frame signal to the buffer 2033-$i$. Further, the IF unit 2031-$i$ reproduces a clock signal based on the received frame signal and outputs the clock signal to the selector unit 2036 and the buffer 2033-$i$.

The buffer 2033-$i$ ($i$=1, 2) is a FIFO (First In, First Out) buffer that buffers the signal received by the IF unit 2031-$i$. The buffer 2033-$i$ receives the frame signal output by the IF unit 2031-$i$ according to a writing timing based on the clock signal output by the IF unit 2031-$i$, and stores the frame signal in a reception order. The buffer 2033-$i$ outputs data of the frame signal stored in the reception order to the system switching unit 2034 according to a reading timing based on a clock signal output by the clock frequency control unit 2037 and the reading speed instructed by the system switching control unit 2035.

For example, it is assumed that the operational system is the active system and the non-operational system is the backup system, and a delay time of the operational system is shorter than a delay time of the non-operational system. In this case, the buffer 2033-1 of the operational system (the active system) delays the reading speed according to the clock signal output by the clock frequency control unit 2037 and the instruction of the system switching control unit 2035 and outputs data. Further, the buffer 2033-2 of the non-operational system (the backup system) outputs data while maintaining the reading speed according to the clock signal output by the clock frequency control unit 2037 and the instruction of the system switching control unit 2035. Specifically, when the planned switching is performed, reading speeds of the buffer 2033-1 and the buffer 2033-2 are set to 1 time/two cycles according to a cycle of the clock signal output by the clock frequency control unit 2037 in a state before switching. When the planned switching is performed, the reading speed of the buffer 2033-1 is decreased to 1 time/3 cycles, whereas the reading speed of the buffer 2033-2 is kept at 1 time/2 cycles, and a delay time difference between the operational system and the non-operational system is adjusted. When the return to the delay difference before the planned switching is performed after the planned switching, the reading speed of the buffer 2033-1 is increased to 2 times/3 cycles, whereas the reading speed of the buffer 2033-2 is kept at 1 time/2 cycles. Thus, the delay time difference between the operational system and the non-operational system is returned to a state before system switching.

The system switching unit 2034 outputs the frame signal output by the buffer 2033-1 to the ODU processing unit 2041 when the active system is selected according to a timing of the clock signal output by the clock frequency control unit 2037, and outputs the frame signal output by the buffer 2033-2 to the ODU processing unit 2041 when the backup system is selected. Further, the system switching unit 2034 instructs the clock frequency control unit 2037 to increase, decrease, or maintain the clock frequency.

For example, when the delay difference between the active system and the backup system is eliminated, the system switching unit 2034 instructs the clock frequency control unit 2037 to output a clock signal in which the clock frequency of the clock signal output by the IF unit 2031-1 is decreased. When the delay difference between the active system and the backup system is eliminated, the system switching unit 2034 instructs the clock frequency control unit 2037 to output a clock signal in which the clock frequency of the clock signal output by the IF unit 2031-1 is maintained. After switching, the system switching unit 2034 instructs the clock frequency control unit 2037 to output a clock signal in which the clock frequency of the clock signal output by the IF unit 2031-2 is maintained. Before switching back from the backup system to the active system is performed, the system switching unit 2034 instructs the clock frequency control unit 2037 to output a clock signal in which the clock frequency of the clock signal output by the IF unit 2031-1 is increased.

The system switching control unit 2035 instructs the buffers 2033-1 and 2033-2, the system switching unit 2034, and the selector unit 2036 to perform switching from the active system to the backup system or from the backup system to the active system. Further, the system switching control unit 2035 monitors the number of pieces of write data and the number of pieces of read data of the respective buffers 2033-1 and 2033-2, and outputs, to the buffer 2033-i (i=1, 2), each reading mode instruction such as an instruction to keep an amount of data accumulated in the buffers 2033-1 and 2033-2 constant, an instruction to increase the reading speed of the buffer 2033-i, an instruction to decrease the reading speed of the buffer 2033-i, and an instruction to follow a designated register value.

The selector unit 2036 outputs the clock signal output by the IF unit 2031-1 to the clock frequency control unit 2037 when the active system is selected, and outputs the clock signal output by the IF unit 2031-2 to the clock frequency control unit 2037 when the backup system is selected. The clock frequency control unit 2037 performs adjustment (increase, decrease, or maintenance) on the clock signal output by the selector unit 2036 according to an instruction from the system switching unit 2034. The clock frequency control unit 2037 outputs the adjusted clock signal to the buffer 2033-1, the buffer 2033-2, the system switching unit 2034, and the demapping unit 2042.

The ODU processing unit 2041 restores the ODU signal from the frame signal output by the system switching unit 2034. The demapping unit 2042 demaps the restored ODU signal to extract the client signal. The demapping unit 2042 is activated by the clock signal output by the clock generator 2043. The demapping unit 2042 outputs the client signal to the client transmission IF unit 2044 according to the timing of the clock signal output by the clock frequency control unit 2037. The client transmission IF unit 2044 outputs the client signal to the transmission line 8003 according to a timing of a clock signal output from the clock generator 2045.

With the above configuration, the clock signal output from the clock frequency control unit 2037 is used as a clock of a reading timing from the buffer 2033-1 and the buffer 2033-2, a driving clock of the system switching unit 2034, and a clock of transmission data of the demapping unit 2042. For example, when the reading speed of the buffer 2033-1 is changed without adjustment of an output clock of the clock frequency control unit 2037, the read data and a phase of the output clock from the clock frequency control unit 2037 are shifted, and the system switching unit 2034 and the demapping unit 2042 are not synchronized. It is also necessary for the output clock of the clock frequency control unit 2037 to be adjusted in order to align the reading speed of the buffer 2033-1 with the phase. Further, it is possible to reduce the number of clock synchronization systems in the receiver 2000 by driving the buffers 2033-1 and 2033-2 with the same clock signal output from the clock frequency control unit 2037.

Figure 5:
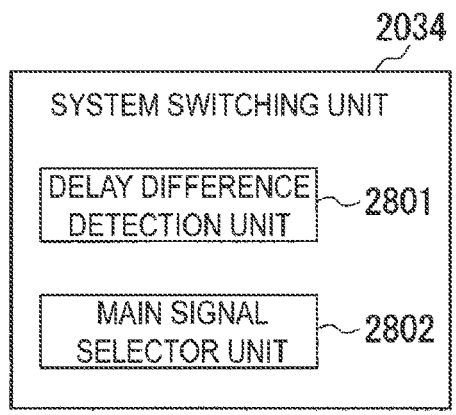
FIG. 5 is a diagram illustrating a detailed configuration of a system switching unit according to the first embodiment.

FIG. 5 is a block diagram illustrating a detailed configuration of the system switching unit 2034. The system switching unit 2034 includes a delay difference detection unit 2801 and a main signal selector unit 2802. The delay difference detection unit 2801 calculates a delay difference between the signal transmitted on the transmission line 8002-1 of the active system and the signal transmitted on the transmission line 8002-2 of the backup system using a frame signal output from the buffer 2033-1 (hereinafter referred to as a "first frame signal") and a frame signal output from the buffer 2033-2 (hereinafter referred to as a "second frame signal"). Specifically, the delay difference detection unit 2801 compares values set in the MFAS and the extended MFAS of the first frame signal with values set in the MFAS and the extended MFAS of the second frame signal, and calculates a delay difference based on a frame pulse (FP). The calculated delay difference is expressed in clock units, for example. Further, the delay difference detection unit 2801 checks the signal transmitted on the transmission line 8002-1 of the active system and the signal transmitted on the transmission line 8002-2 of the backup system according to whether or not a value set in a TTI of the first frame signal and a value set in a TTI of the second frame signal match.

The main signal selector unit 2802 selects any one frame signal of the first frame signal of the active system input from the buffer 2033-1 and the second frame signal of the backup system input from the buffer 2033-2 to be output according to an instruction from the system switching control unit 2035. Further, the main signal selector unit 2802 has a failure non-instantaneous interruption switching function for performing data selection switching to output any one of the first frame signal of the active system and the second frame signal of the backup system by using a failure notification received by the control unit 2011 as a trigger. Selection of a default is an active system.

Further, the main signal selector unit 2802 performs adjustment of phases of the active system and the backup system and absorbs a delay difference adjustment error for one cycle between the buffer 2033-1 and the buffer 2033-2. Specifically, the main signal selector unit 2802 checks data of succeeding clocks (the first frame signal and the second frame signal) when switching between the frame signals to be output is performed, and performs data switching without instantaneous interruption.

Figure 6:
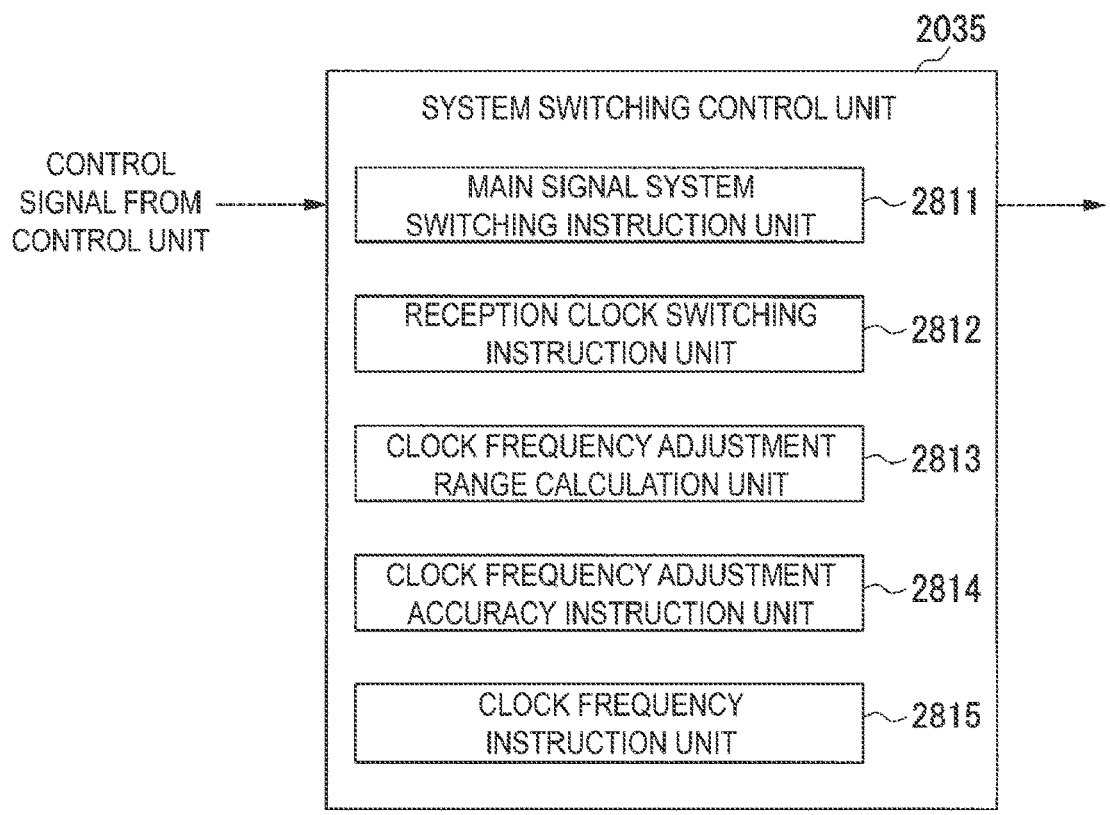
FIG. 6 is a diagram illustrating a detailed configuration of a system switching control unit according to the first embodiment.

FIG. 6 is a block diagram illustrating a detailed configuration of the system switching control unit 2035. The system switching control unit 2035 includes a main signal system switching instruction unit 2811, a reception clock switching instruction unit 2812, a clock frequency adjustment range calculation unit 2813, a clock frequency adjustment accuracy instruction unit 2814, and a clock frequency adjustment instruction unit 2815.

The main signal system switching instruction unit 2811 instructs the buffers 2033-1 and 2033-2 and the selector unit 2036 to perform switching between the active system and the backup system. The reception clock switching instruction unit 2812 instructs the selector unit 2036 to perform switching between the active system and the backup system. The clock frequency adjustment range calculation unit 2813 calculates an upper limit of the clock frequency adjustment range based on a difference between the clock frequency deviation of the clock generators 1022, 1024, 1032-1, 1032-2, 1034-1, and 1034-2 included in the transmitter 1000, the clock generators 2022-1, 2022-2, 2024-1, 2024-2, 2032-1, 2032-2, 2043, and 2045 included in the receiver 2000, and the clock frequency control unit 2037 and a prescribed stand value. The clock frequency adjustment accuracy instruction unit 2814 determines the clock frequency adjustment range for delay difference adjustment within the upper limit calculated by the clock frequency adjustment range calculation unit 2813, and provides an instruction on the clock frequency adjustment range to the clock frequency control unit 2037. The clock frequency adjustment instruction unit 2815 outputs an internal control signal for instructing an increase, decrease, or maintenance of the clock frequency to the clock frequency control unit 2037.

The clock frequency adjustment range calculation unit 2813 determines the clock frequency adjustment range as follows. First, the clock generators 1022, 1024, 1032-1, 1034-1, 1032-2, 1034-2, 2022-1, 2024-1, 2022-2, 2024-2, 2032-1, and 2032-2, the clock frequency control unit 2037, and the clock generator 2043 are described as clock generators clk_1, clk_2, clk_3, . . . , clk_14, respectively. The clock frequency deviation of the clock generator clk_n (n=1 to 14) is $df_{clk\_n}$. In the present embodiment, it is assumed that the clock generator clk_n having a known clock frequency deviation $df_{clk\_n}$ is used for the transmitter 1000 and the receiver 2000, and the clock frequency deviations $df_{clk\_1}$ to $df_{clk\_14}$ are all the same value $d_{fclk}$ [ppm].

Further, a minimum value [ppm] of the standard value of the clock frequency deviation on a transmission network using the OTU4 is set to $df_{STD\_min}$. Further, the clock frequency deviation $d_{fclk}$ [ppm] of the clock generator=$d_{fclk\_n}$ from the above. In this case, a maximum value $\Delta f_{PL\_max}$ [ppm] of the frequency adjustment range to be used for the non-instantaneous interruption switching is calculated as follows.

$$\Delta f_{PL\_max}=|df_{STD\_min}|-|d_{fclk}|; (df_{STD\_min}>d_{fclk})$$

For example, when $df_{STD\_min}=+/-20$ [ppm] and $d_{fclk}=+/-10$ [ppm], $\Delta f_{PL\_max}=+/31$ 10 [ppm]. Further, as another example, when $df_{STD\_min}=+/-100$ [ppm] and $d_{fclk}=+/-20$ [ppm], $\Delta f_{PL\_max}=+/-80$ [ppm].

When non-instantaneous interruption switching at the time of a failure is performed, the system switching control unit 2035 operates as follows. In a normal time, it is assumed that the active system is an operational system and the backup system is a non-operational system. First, the system switching control unit 2035 adjusts the delay difference between the active system and the backup system to zero in advance. The buffers 2033-1 and 2033-2 accumulate the frame signals for observation delay and control delay from the occurrence of a failure of the main signal to the reception of a failure notification signal in advance. When the failure notification signal is received from the monitoring unit 2012, the main signal system switching instruction unit 2811 and the reception clock switching instruction unit 2812 performs an instruction to switch the main signal and the reception clock to the non-operational system. Further, in order to prevent disturbance of a frequency due to switching of the clock signal output by the selector unit 2036 when the main signal system is switched to the non-operational system, the clock frequency adjustment instruction unit 2815 outputs a clock frequency maintenance signal that is the internal control signal to the clock frequency control unit 2037 and fixes a transmission clock frequency.

Figure 7:
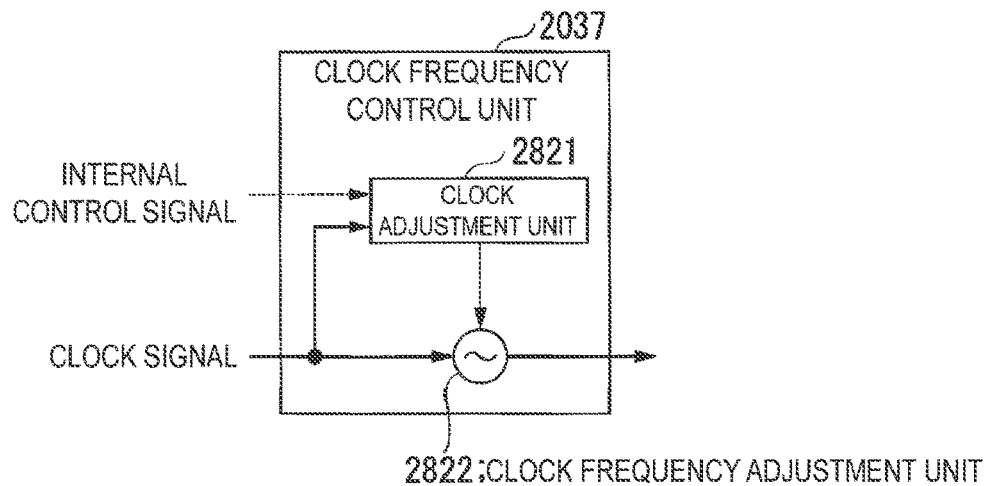
FIG. 7 is a diagram illustrating a detailed configuration of a clock frequency control unit according to the first embodiment.

FIG. 7 is a diagram illustrating details of the clock frequency control unit 2037. The clock frequency control unit 2037 includes a clock adjustment unit 2821 and a clock frequency adjustment unit 2822.

The clock adjustment unit 2821 outputs a control signal for controlling a transmission clock, that is, for instructing to increase or decrease a frequency based on an instruction of the internal control signal output by the clock frequency adjustment instruction unit 2815 and the reception clock (switched according to a setting) of the active system or the backup system. Specifically, the clock adjustment unit 2821 outputs an increase pulse or a decrease pulse that is a control signal, to the clock frequency adjustment unit 2822 every frequency adjustment accuracy value set in a register×N cycles. Each time the clock frequency adjustment unit 2822 receives the control signal output by the clock adjustment unit 2821, the clock frequency adjustment unit 2822 increases or decreases a reference clock of an internal phase locked loop (PLL) by 1/(frequency adjustment accuracy value×N) to increase or decrease the clock frequency of the output clock signal. The reception clock is the clock signal output by the selector unit 2036. The transmission clock is a clock signal output by the clock frequency adjustment unit 2822. The selector unit 2036 automatically switches the clock signal serving as the reception clock in the clock adjustment unit 2821 according to the instruction of the system switching control unit 2035 triggered by the failure notification.

The clock frequency adjustment unit 2822 synchronizes the output clock by using the clock signal selected by the selector unit 2036 as the reference clock (reception clock). Further, the clock frequency adjustment unit 2822 controls the frequency deviation between the output clock and the selected reception clock based on a frequency increase instruction pulse/frequency decrease instruction pulse output by the clock adjustment unit 2821.

Figure 8:
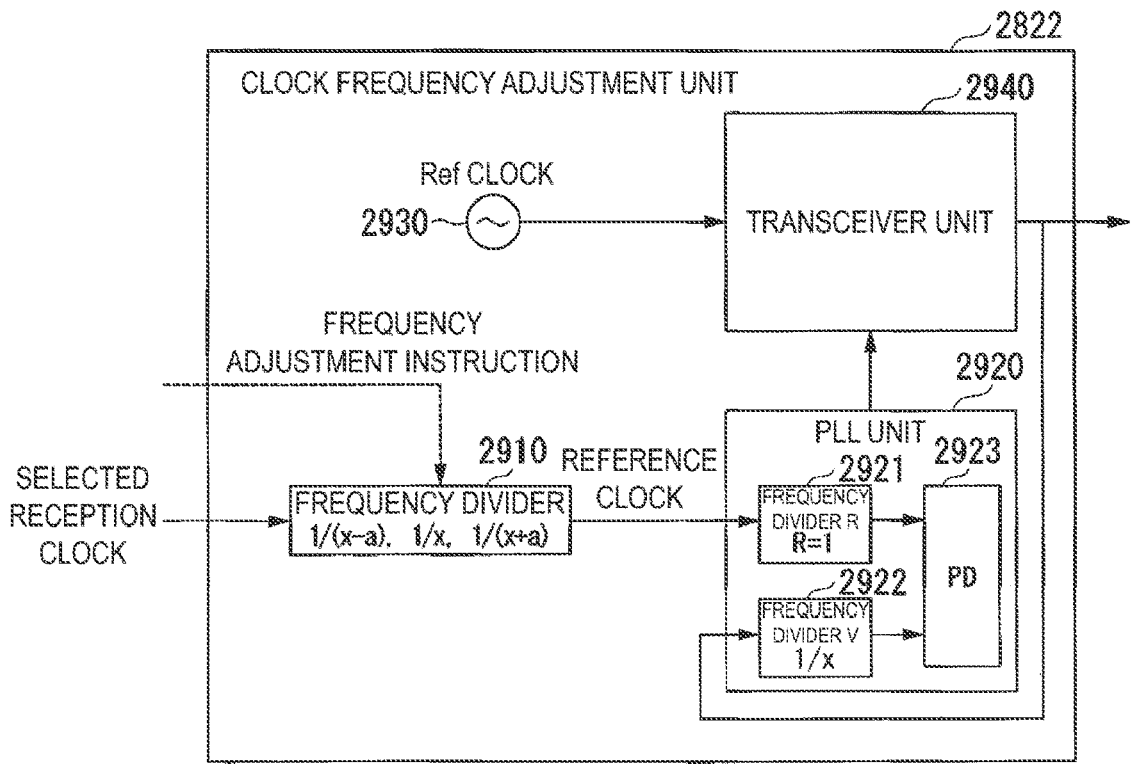
FIG. 8 is a diagram illustrating a detailed configuration of a clock frequency adjustment unit according to the first embodiment.

FIG. 8 is a diagram illustrating a detailed configuration of the clock frequency adjustment unit 2822. The clock frequency adjustment unit 2822 includes a frequency divider 2910, a PLL unit 2920, a reference (Ref) clock generator 2930, and a transceiver unit 2940.

The frequency divider 2910 changes a frequency division ratio of the reception clock according to a frequency adjustment instruction using the increase pulse or the decrease pulse output from the clock adjustment unit 2821 to generate the reference clock of which the frequency has been increased or decreased. The frequency divider 2910 divides the frequency by $1/(x-a)$ at the time of an increase instruction, $1/x$ in normal time, and $1/(x+a)$ at the time of a decreasing instruction. The frequency deviation can be controlled by a pulse instruction interval (the deviation is made small when the interval is large and is made large when the interval is small).

A frequency divider 2921 of the PLL unit 2920 outputs a reference clock output by the frequency divider 2910, and a frequency divider 2922 divides a clock signal output from the transceiver unit 2940. A phase detector (PD) 2923 outputs a signal indicating a phase difference between an output of the frequency divider 2921 and an output of the frequency divider 2922. The PLL unit 2920 holds a value of a phase difference signal when the clock frequency maintenance signal is received. The transceiver unit 2940 generates a clock signal (output clock) having a phase indicated by the phase difference signal using a clock signal output by the reference clock generator 2930, and outputs the clock signal.

As described above, the frequency divider 2910 decreases or increases a frequency division ratio of the clock frequency input to the PLL unit 2920 using a frequency increase/frequency decrease pulse. A frequency change rate can be adjusted using a period of a frequency increase/frequency decrease instruction pulse. Further, the frequency deviation can be increased by decreasing a pulse interval, and the frequency deviation can be decreased by increasing the pulse interval.

SECOND EMBODIMENT

The transmitter 1000 and the receiver 2000 of the first embodiment had a pluggable configuration. The second embodiment is a transmitter and a receiver that do not have a pluggable configuration. Hereinafter, differences from the first embodiment will be mainly described.

Figure 9:
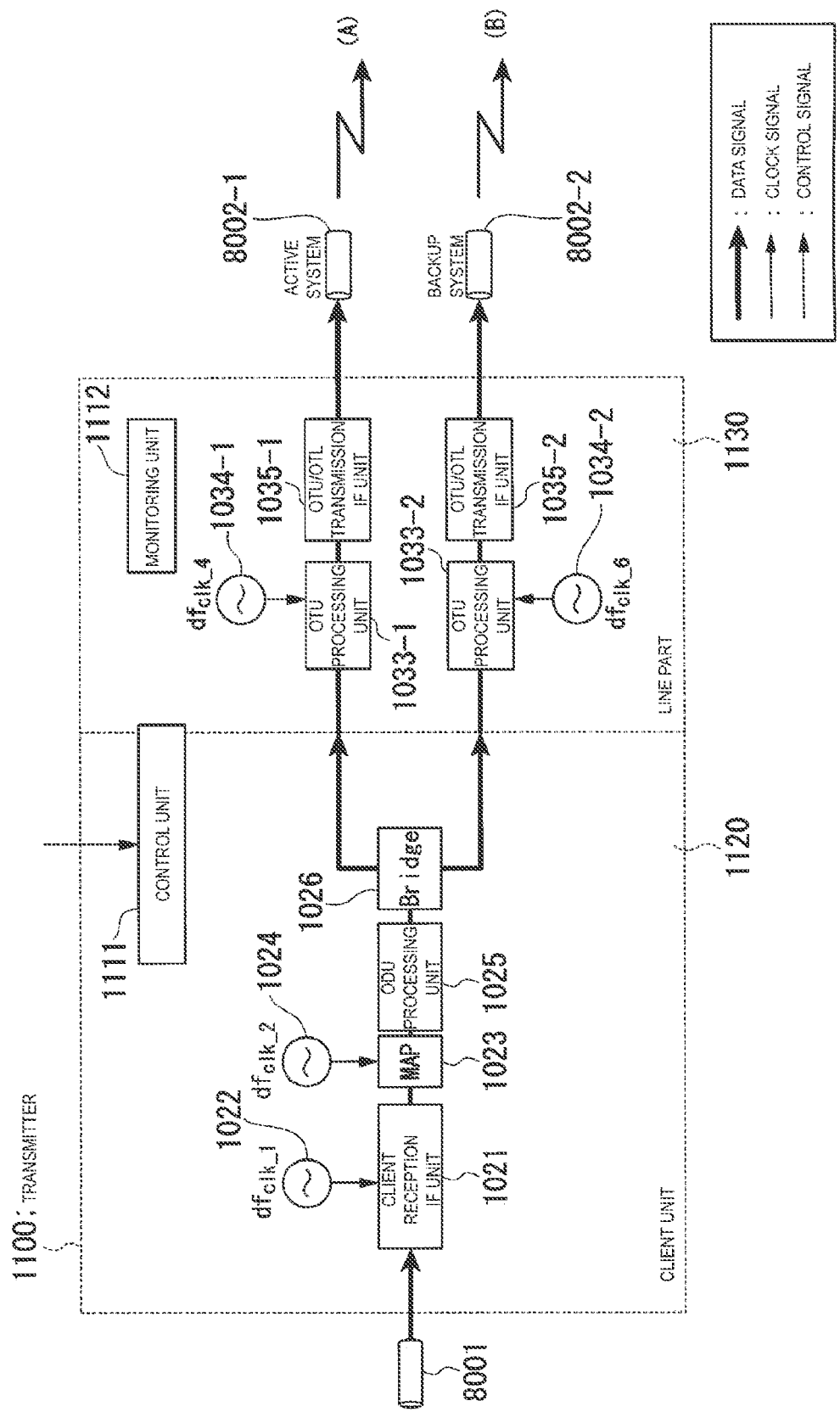
FIG. 9 is a configuration diagram of a transmitter according to a second embodiment.

FIG. 9 is a configuration diagram of a transmitter 1100 according to the second embodiment. In FIG. 9, parts the same as those of the transmitter 1000 of the first embodiment illustrated in FIG. 3 are denoted by the same reference signs, and description thereof will be omitted. The transmitter 1100 includes a control unit 1111, a monitoring unit 1112, a client unit 1120, and a line part 1130. The control unit 1111 controls the client unit 1120 and the line part 1130. The monitoring unit 1112 monitors the client unit 1120 and the line part 1130 and performs, for example, detection of the occurrence of a failure.

The client unit 1120 includes a client reception IF unit 1021, a clock generator 1022, a mapping unit 1023, a clock generator 1024, an ODU processing unit 1025, and a bridge 1026. The line part 1130 includes OTU processing units 1033-1 and 1033-2, clock generators 1034-1 and 1034-2, and OTU/OTL transmission IF units 1035-1 and 1035-2.

With the above configuration, the bridge 1026 outputs a data signal (ODU4 frame) output by the ODU processing unit 1025 to the OTU processing units 1033-1 and 1033-2.

Figure 10:
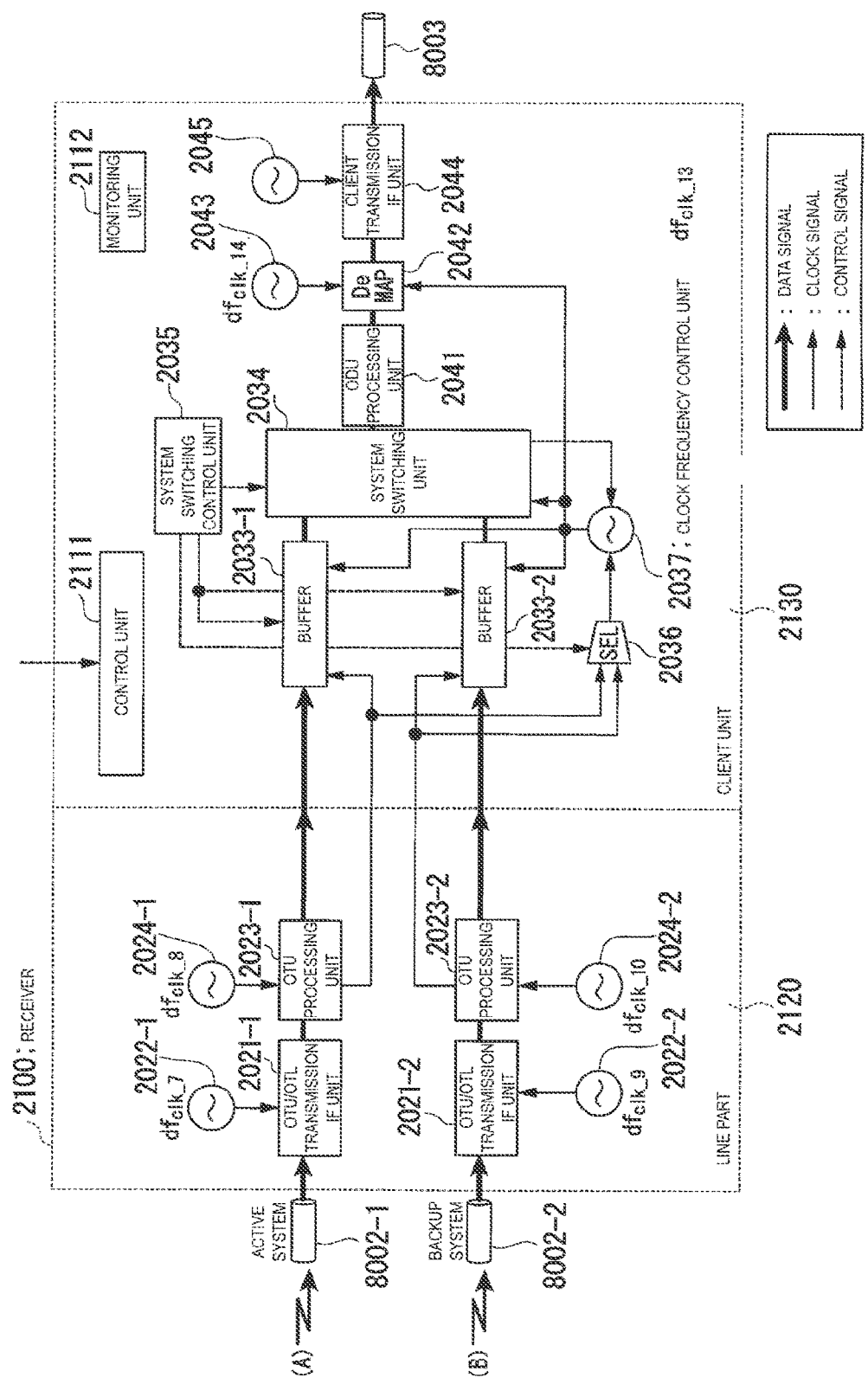
FIG. 10 is a configuration diagram of a receiver according to the second embodiment.

FIG. 10 is a configuration diagram of the receiver 2100 according to the present embodiment. In FIG. 10, parts the same as those of the receiver 2000 of the first embodiment illustrated in FIG. 4 are denoted by the same reference signs, and description thereof will be omitted. The receiver 2100 includes a control unit 2111, a monitoring unit 2112, a line part 2120, and a client unit 2130. The control unit 2111 controls the line part 2120 and the client unit 2130. The monitoring unit 2112 monitors the line part 2120 and the client unit 2130 and performs, for example, detection of the occurrence of a failure.

The line part 2120 includes OTU/OTL reception IF units 2021-1 and 2021-2, clock generators 2022-1 and 2022-2, OTU processing units 2023-1 and 2023-2, and clock generators 2024-1 and 2024-2. The client unit 2130 includes buffers 2033-1 and 2033-2, a system switching unit 2034, a system switching control unit 2035, a selector unit 2036, a clock frequency control unit 2037, an ODU processing unit 2041, a demapping unit 2042, a clock generator 2043, a client transmission IF unit 2044, and a clock generator 2045.

With the above configuration, the buffer 2033-$i$ ($i=1, 2$) buffers the frame signal output by the OTU processing unit 2023-$i$. Further, the OTU processing unit 2023-$i$ reproduces the clock signal based on the received frame signal and outputs the clock signal to the buffer 2033-$i$ and the selector unit 2036. When the active system is selected, the selector unit 2036 selects the clock signal output by the OTU processing unit 2023-1 instead of the clock signal output by the IF unit 2031-1 of the first embodiment, and outputs the clock signal to the clock frequency control unit 2037. When the backup system is selected, the selector unit 2036 selects the clock signal output by the OTU processing unit 2023-2 instead of the clock signal output by the IF unit 2031-2 of the first embodiment, and outputs the clock signal to the clock frequency control unit 2037.

THIRD EMBODIMENT

In the first embodiment, the clock frequency accuracy of the clock generator to be used for each of the transmitter and the receiver was known. In the third embodiment, the clock frequency accuracy of the clock generator to be used for each of the transmitter and the receiver is measured. Hereinafter, differences from the first embodiment will be mainly described.

Figure 11:
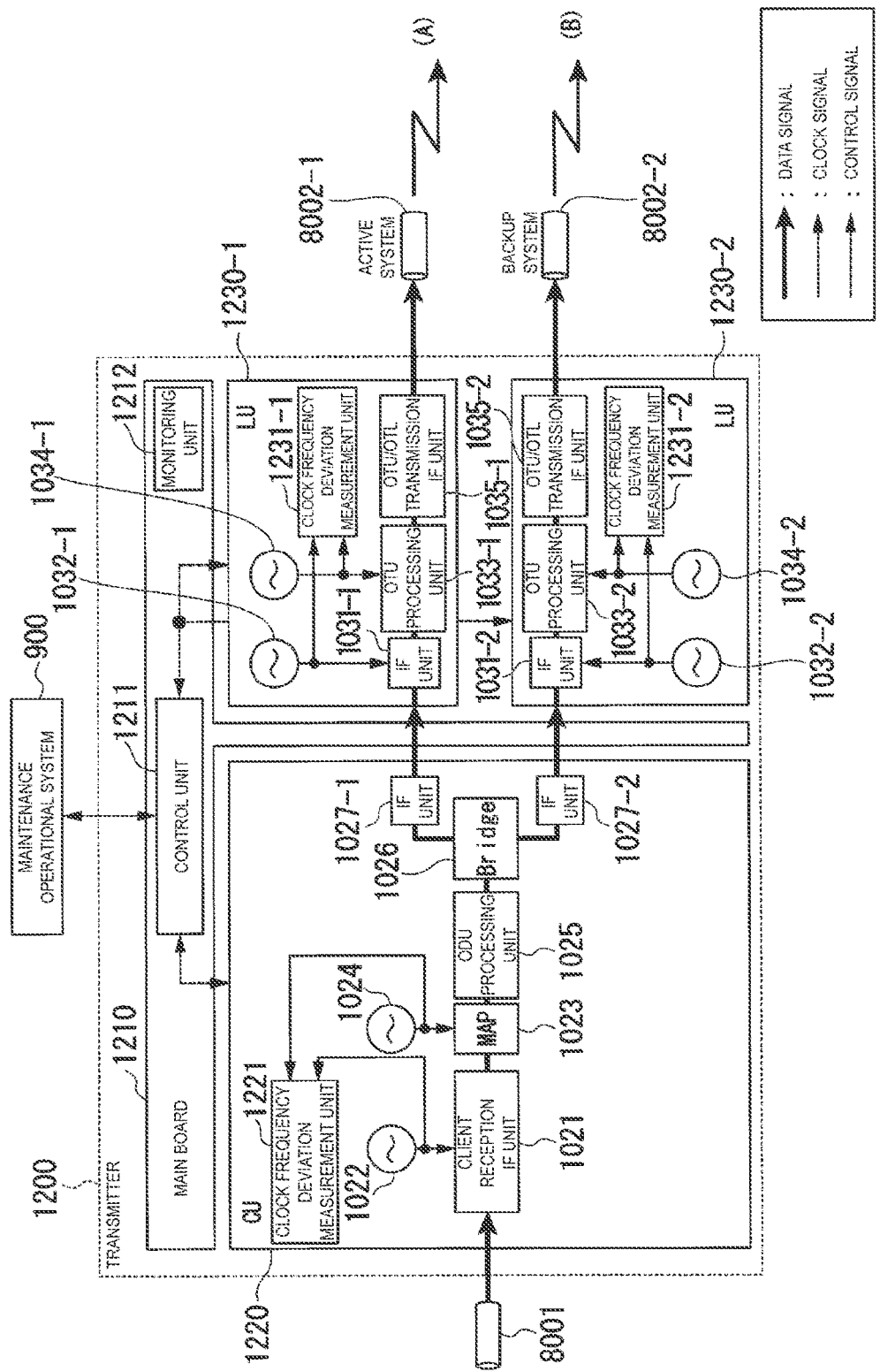
FIG. 11 is a configuration diagram of a transmitter according to a third embodiment.

FIG. 11 is a configuration diagram of a transmitter 1200 according to the third embodiment. In FIG. 11, parts the same as those of the transmitter 1000 of the first embodiment illustrated in FIG. 3 are denoted by the same reference signs, and description thereof will be omitted. The transmitter 1200 includes a main board 1210, a CU 1220, and two LUs 1230. The transmitter 1200 has a pluggable configuration. That is, the CU 1220 and the LU 1230 are units that can be attached to and detached from the main board 1210. Hereinafter, the LU 1230 connected to the transmission line 8002-$i$ ($i=1, 2$) will be described as an LU 1230-$i$.

The main board 1210 includes a control unit 1211 and a monitoring unit 1212. The control unit 1211 controls the CU 1220 and the LU 1230. Further, the control unit 1211 notifies a maintenance operational system 900 of the clock frequency deviation notified of from the CU 1220 and the LU 1230. The monitoring unit 1212 monitors the CU 1220 and the LU 1230 and performs, for example, detection of the occurrence of a failure. The maintenance operational system 900 is, for example, an operation support system (OSS).

The CU 1220 differs from the CU 1020 of the first embodiment in that the CU 1220 further includes the clock frequency deviation measurement unit 1221. The clock frequency deviation measurement unit 1221 measures the clock frequency deviation of each of the clock generator 1022 and the clock generator 1024, and outputs the clock frequency deviation to the control unit 1211.

The LU 1230-$i$ ($i$=1, 2) differs from the LU 1030-$i$ of the first embodiment in that the LU 1230-$i$ further includes the clock frequency deviation measurement unit 1231-$i$. The clock frequency deviation measurement unit 1231-$i$ measures the clock frequency deviation of each of the clock generator 1032-$i$ and the clock generator 1034-$i$, and outputs the clock frequency deviation to the control unit 1211.

Figure 12:
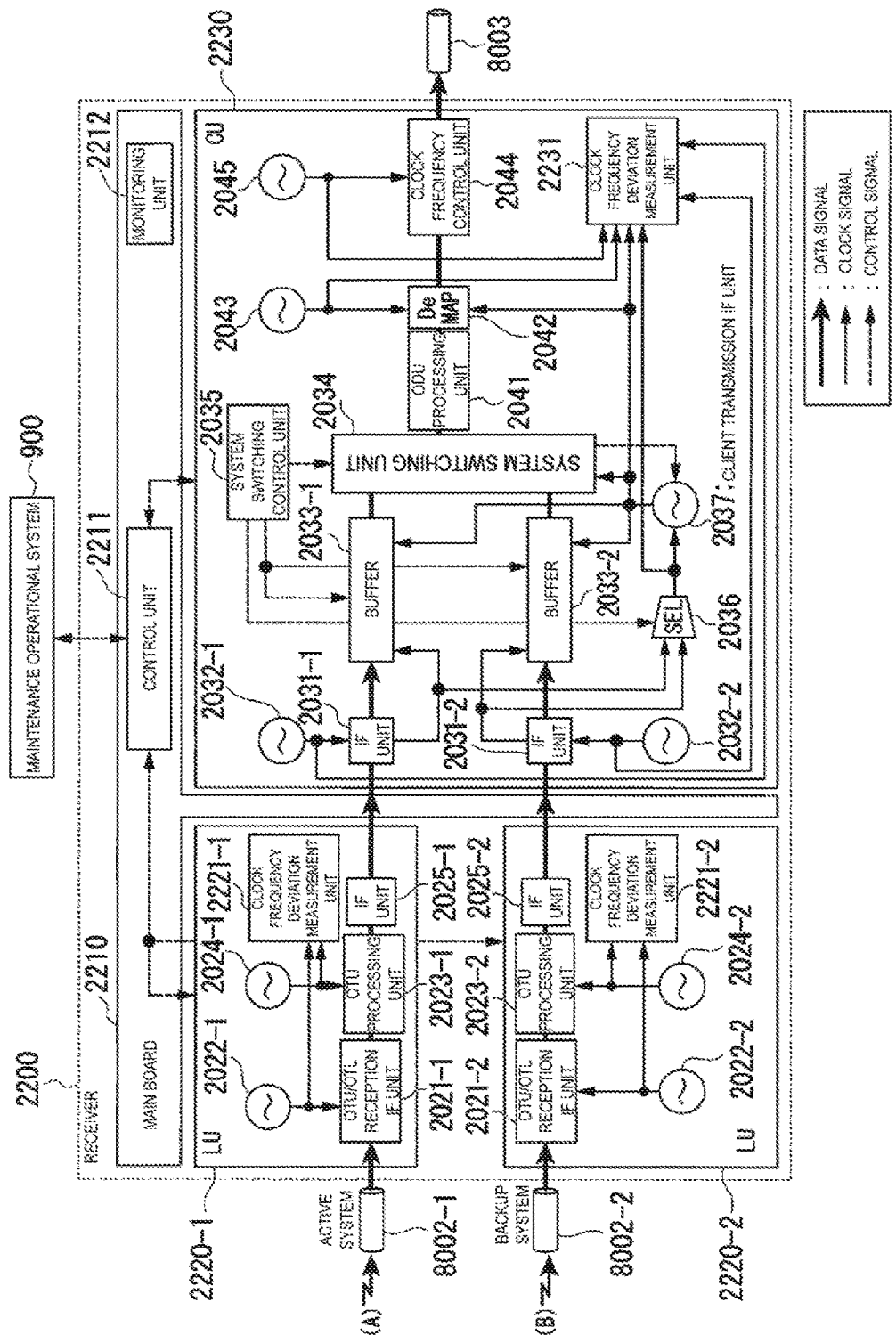
FIG. 12 is a configuration diagram of a receiver according to the third embodiment.

FIG. 12 is a configuration diagram of a receiver 2200 according to the third embodiment. In FIG. 12, parts the same as those of the receiver 2000 of the first embodiment illustrated in FIG. 4 are denoted by the same reference signs, and description thereof will be omitted. The receiver 2200 includes a main board 2210, two LUs 2220, and a CU 2230. The receiver 2200 has a pluggable configuration. That is, the LU 2220 and the CU 2230 are units that can be attached to and detached from the main board 2210. Hereinafter, the LU 2220 connected to the transmission line 8002-$i$ ($i$=1, 2) will be described as an LU 2220-$i$.

The main board 2210 includes a control unit 2211 and a monitoring unit 2212. The control unit 2211 controls the LU 2220 and the CU 2230. Further, the control unit 2211 notifies the maintenance operational system 900 of the clock frequency deviation notified of from the LU 2220 and the CU 2230. The monitoring unit 2212 monitors LU 2220 and CU 2230 and performs, for example, detection of the occurrence of a failure.

The LU 2220-$i$ ($i$=1, 2) differs from the LU 2020-$i$ of the first embodiment in that LU 2220-$i$ further includes a clock frequency deviation measurement unit 2221-$i$. The clock frequency deviation measurement unit 2221-$i$ ($i$=1, 2) measures the clock frequency deviation of each of the clock generator 2022-$i$ and the clock generator 2024-$i$, and outputs the clock frequency deviation to the control unit 2211.

The CU 2230 differs from the CU 2030 of the first embodiment in that the CU 2230 further includes a clock frequency deviation measurement unit 2231. The clock frequency deviation measurement unit 2231 measures the clock frequency deviations of the clock generators 2032-1 and 2032-2, the clock frequency control unit 2037, the clock generator 2043, and the clock generator 2045, and outputs the clock frequency deviations to the control unit 2311.

The maintenance operational system 900 notifies the control unit 2211 of the receiver 2200 of the clock frequency deviation of each clock generator received from the transmitter 1200 and the receiver 2200. The control unit 2211 notifies the system switching control unit 2035 of the received clock frequency deviation. The clock frequency adjustment range calculation unit 2813 of the system switching control unit 2035 calculates the clock frequency adjustment range using the notified clock frequency deviation.

The transmitter 1200 may include a clock frequency deviation measurement unit on the main board 1210 instead of the clock frequency deviation measurement units 1221, 1231-1, and 1231-2. The clock frequency deviation measurement unit included in the main board 1210 measures the clock frequency deviation of each of the clock generators 1022, 1024, 1032-1, 1032-2, 1034-1, and 1034-2, and outputs the clock frequency deviation to the control unit 1211.

Similarly, the receiver 2200 may include a clock frequency deviation measurement unit on the main board 2210 instead of the clock frequency deviation measurement units 2221-1, 2221-2, and 2231.

The clock frequency deviation measurement unit included in the main board 2210 measures a clock frequency deviation of each of the clock generators 2022-1, 2022-2, 2024-1, 2024-2, 2032-1, 2032-2, 2043, and 2045 and the clock frequency control unit 2037, and outputs the clock frequency deviation to the control unit 2211.

Further, the difference between the first embodiment and the third embodiment described above can be applied to the transmitter 1100 and the receiver 2100 of the second embodiment.

In the present embodiment, the clock frequency adjustment range is calculated as shown below.

The clock generators 1022, 1024, 1032-1, 1034-1, 1032-2, 1034-2, 2022-1, 2024-1, 2022-2, 2024-2, 2032-1, and 2032-2, the clock frequency control unit 2037, and the clock generator 2043 are described as clock generators clk_1, clk_2, clk_3, . . . , clk14, and the clock frequency deviation of the clock generator clk_m ($m$=1 to 14) is described as $df_{clk\_m}$, similar to the first embodiment.

First, calculation of the frequency deviation in the clock frequency deviation measurement units 1221, 1231-1, 1231-2, 2221-1, 2221-2, and 2231 (hereinafter collectively referred to as a "clock frequency deviation measurement unit") will be described. A reference frequency [Hz] of each clock generator clk_m ($m$=1, 2, 3, . . . ) is denoted by $f_{0clk\_m}$, and a frequency [Hz] of the clock generator clk_m measured by the clock frequency deviation measurement unit is denoted by $f_{clk\_m}$. In this case, the clock frequency deviation measurement unit calculates the frequency deviation $df_{clk\_m}$ [ppm] of the clock generator clk_m as follows.

$$df_{clk\_m} = (f_{0clk\_m} - f_{clk\_m})/f_{0clk\_m}$$

A maximum value [ppm] of the frequency deviation of the clock generator clk_m is denoted by $df_{clk\_m\_max}$, and a minimum value [ppm] of the frequency deviation of the clock generator clk_m is denoted by $df_{clk\_m\_min}$. The clock frequency deviation measurement units 1221, 1231-1, and 1231-2 output the calculated $df_{clk\_m\_max}$ and $df_{clk\_m\_min}$ to the control unit 1211, and the clock frequency deviation measurement units 2221-1, 2221-2, and 2231 output the calculated $df_{clk\_m\_max}$ and $df_{clk\_m\_min}$ to control unit 2211.

Next, a process in which the clock frequency adjustment range calculation unit 2813 determines the clock frequency adjustment range using the above frequency deviation measured by the clock frequency deviation measurement unit will be described. First, a minimum value [ppm] of a standard value of a clock frequency deviation in a +direction on a transmission network using OTU4 is denoted by $df_{STD(+)\_min}$, and a minimum value [ppm] in a −direction is denoted by $df_{STD(-)\_min}$. In this case, the clock frequency adjustment range calculation unit 2813 calculates a maximum value $\Delta fPL_{+\_max}$ [ppm] of a frequency adjustment range in a +direction and a maximum value $\Delta fPL_{(-)\_max}$ in a −direction that are used for non-instantaneous interruption switching, as follows.

$$\Delta fPL_{(+)\_max} = df_{STD(+)\_min} - df_{clk\_m\_max};$$
$$(df_{STD(+)\_min} > df_{clk\_m\_max})$$

$$\Delta fPL_{(-)\_max} = df_{STD(-)\_min} - df_{clk\_m\_min};$$
$$(df_{STD(-)\_min} > df_{clk\_min\_m\_min})$$

For simplicity, three clock generators clk_1 to clk_3 will be described as an example. It is assumed that the following is obtained for the clock generator clk_m ($m$=1 to 3).

$f_{0clk\_1}$=350 [MHz]
$f_{clk\_1}$=350.00175 [MHz]
$df_{clk\_1}$=+5 [ppm]
$f_{0clk\_2}$=350 [MHz]
$f_{clk\_2}$=350.00105 [MHz]
$df_{clk\_2}$=+3 [ppm]
$f_{0clk\_3}$=350 [MHz]
$f_{clk\_3}$=349.99860 [MHz]

$df_{clk\_3} = -4$ [ppm]

From the above, $df_{clk\_m\_max}$ max and $df_{clk\_m\_min}$ max are as follows.

$df_{clk\_m\_max} = df_{clk\_1} = +5$ [ppm]  $df_{clk\_m\_min} = df_{clk\_3} = -4$ [ppm]

The clock frequency adjustment range calculation unit 2813 calculates $\Delta fPL_{(+)\_max}$ and $\Delta fPL_{(+)\_min}$ as follows.

$df_{STD\_min} = +/-20$ [ppm]

$df_{STD(+)\_min} = +20$ [ppm]

$df_{STD(-)\_min} = -20$ [ppm]

$\Delta fPL_{(+)\_max} = (+20 \text{ [ppm]}) - (+5 \text{ [ppm]}) = +15$ [ppm]

$\Delta fPL_{(-)\_max} = (-20 \text{ [ppm]}) - (-4 \text{ [ppm]}) = -16$ [ppm]

According to the above calculation result, a maximum clock frequency adjustment range can be set to +15 [ppm] in a positive direction and −16 [ppm] in a negative direction.

As described above, in the present embodiment, the clock frequency adjustment range calculation unit 2813 of the receiver 2200 receives an instruction from the control unit 2211, an upper operation system (OSS) such as the maintenance operational system 900, a maintenance person, or the like, and obtains a difference between a value of the frequency deviation prescribed in the standard and a value of the frequency deviation measured by the clock frequency deviation measurement unit. The clock frequency adjustment accuracy instruction unit 2814 controls the frequency adjustment range so that the clock adjustment range is maximized based on the calculated difference.

FOURTH EMBODIMENT

In the present embodiment, when the planned switching is performed, a determination is made as to whether or not the delay difference can be eliminated within a time set by a maintenance person. Hereinafter, differences from the third embodiment will be mainly described. The transmitter 1200 and the receiver 2200 of the third embodiment can be used as a transmitter and a receiver of the present embodiment.

Figure 13:
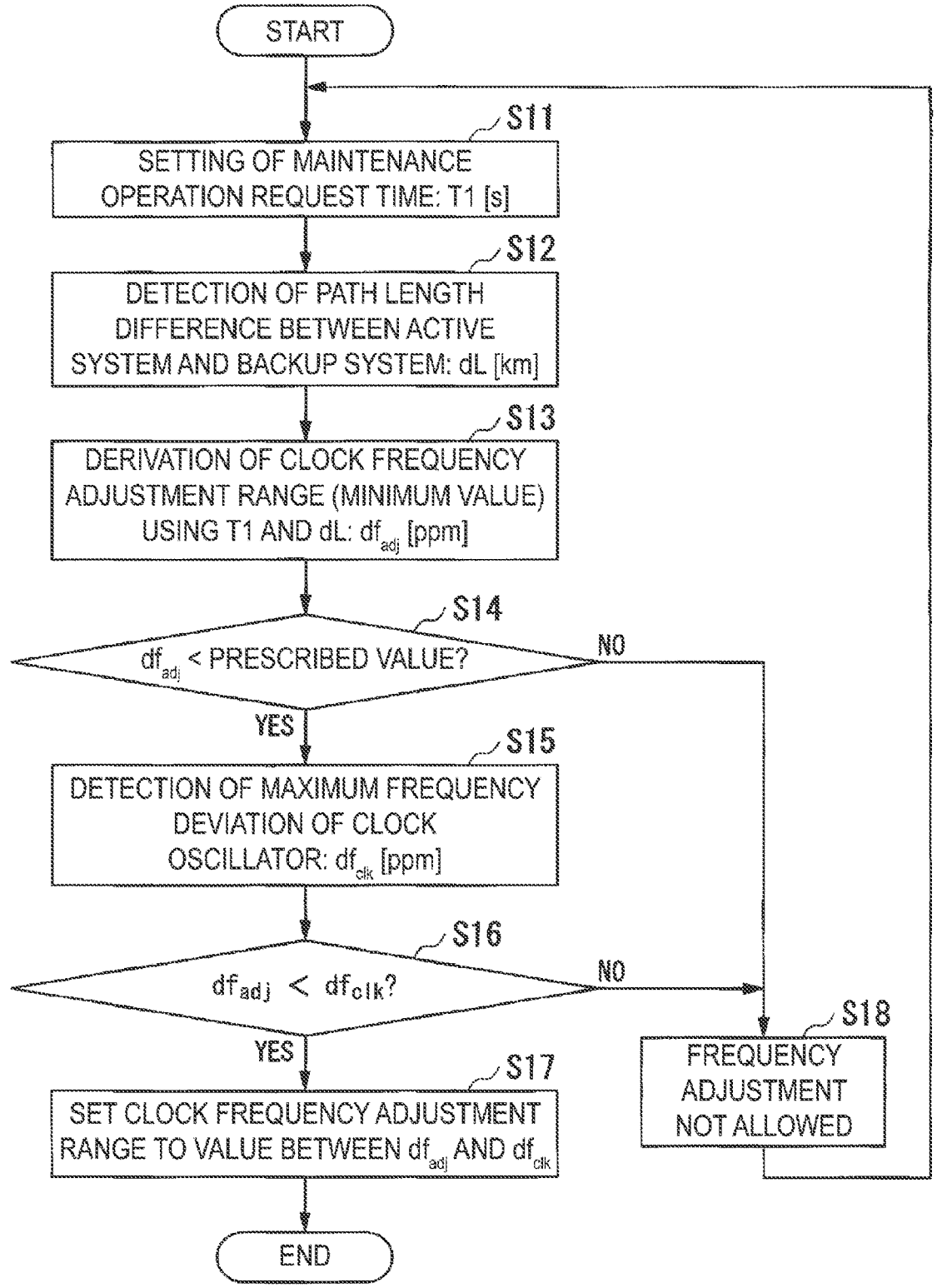
FIG. 13 is a flowchart illustrating a process of a receiver according to a fourth embodiment.

FIG. 13 is a flowchart illustrating a process in the receiver 2200 of the present embodiment. First, when the maintenance person notifies the maintenance operational system 900 of a maintenance operation request time T1 [s], the maintenance operational system 900 notifies the control unit 2211 of the receiver 2200 of the maintenance operation request time T1 [s]. The control unit 2211 outputs the maintenance operation request time T1 [s] to the system switching control unit 2035 (step S11). The delay difference detection unit 2801 of the system switching unit 2034 detects a difference in timing of the frame signal at which the same signal is output from the buffers 2033-1 and 2033-2, using the MFAS and the extended MFAS, and calculates a path length difference dL [km] between the active system and the backup system based on the difference (step S12). The delay difference detection unit 2801 may calculate a path time difference T2 [us] instead of the path length difference dL [km].

The clock frequency adjustment range calculation unit 2813 of the system switching control unit 2035 calculates a minimum value $dfad_j$ [ppm] of the clock frequency adjustment range as follows using the maintenance operation request time T1 and the path length difference dL [km] (step S13).

$$df_{adj}[ppm] = (dL[km] \times 5 \ [us/km])/(T1 \ [s] \times 10^{-6})$$

When the path time difference T2 [us] is used, the minimum value $dfad_j$ [ppm] of the clock frequency adjustment range is calculated as follows.

$$df_{adj}[ppm] = (T2 \ [us])/(T1 \ [s] \times 10^{-6})$$

The clock frequency adjustment range calculation unit 2813 determines whether or not the calculated minimum value $df_{adj}$ of the clock frequency adjustment range is smaller than the prescribed value (step S14). The prescribed standard value dfstd can be used as the prescribed value. In accordance with a determination by the clock frequency adjustment range calculation unit 2813 that the calculated minimum value is smaller than the prescribed value (step S14: YES), the clock frequency adjustment range calculation unit 2813 detects a maximum value $df_{clk}$ [ppm] of the frequency deviation from the clock generators clk_1 to clk_14 (step S15).

The clock frequency adjustment range calculation unit 2813 determines whether or not the maximum value $df_{clk}$ [ppm] of the frequency deviation is larger than the minimum value $dfad_j$ [ppm] of the clock frequency adjustment range (step S16). In accordance with a determination by the clock frequency adjustment range calculation unit 2813 that the maximum value is larger (step S16: YES), the clock frequency adjustment accuracy instruction unit 2814 determines a value equal to or greater than $df_{adj}$ [ppm] and equal to or smaller than $df_{clk}$ [ppm] to be the clock frequency adjustment range. The clock frequency adjustment accuracy instruction unit 2814 provides an instruction on the determined clock frequency adjustment range to the clock frequency control unit 2037 (step S17). The clock frequency adjustment accuracy instruction unit 2814 may perform adjustment according to a maximum frequency adjustment range calculated as in the third embodiment. When the delay difference detection unit 2801 detects that the delay difference between the active system and the backup system has disappeared due to the adjustment of the clock frequency, the delay difference detection unit 2801 notifies the maintenance operational system 900 of adjustment completion via the control unit 2211. The maintenance operational system outputs the completion of the delay difference adjustment to notify the maintenance person of the completion.

In accordance with a determination by the clock frequency adjustment range calculation unit 2813 that the calculated minimum value $df_{adj}$ of the clock frequency adjustment range is equal to or larger than the prescribed value (step S14: NO) or in accordance with a determination by the clock frequency adjustment range calculation unit 2813 that the maximum value $df_{clk}$ [ppm] of the frequency deviation is equal to or smaller than the minimum value $df_{adj}$ [ppm] of the clock frequency adjustment range (step S16: NO), the clock frequency adjustment range calculation unit 2813 determines that the frequency adjustment is not allowed (step S18). The clock frequency adjustment range calculation unit 2813 notifies the control unit 2311 that the frequency adjustment is not allowed, and the control unit 2311 notifies the maintenance operational system 900 that the frequency adjustment is not allowed. The maintenance operational system 900 displays that the frequency adjustment is not allowed to notify the maintenance person that the frequency adjustment is not allowed.

Although a measurement result at each clock frequency deviation measurement unit is used as the maximum value of the clock frequency deviation of the clock generator as described above, a known maximum value of a clock frequency deviation may be used for each clock generator when the present embodiment is applied to the first embodiment and the second embodiment.

Figure 14:
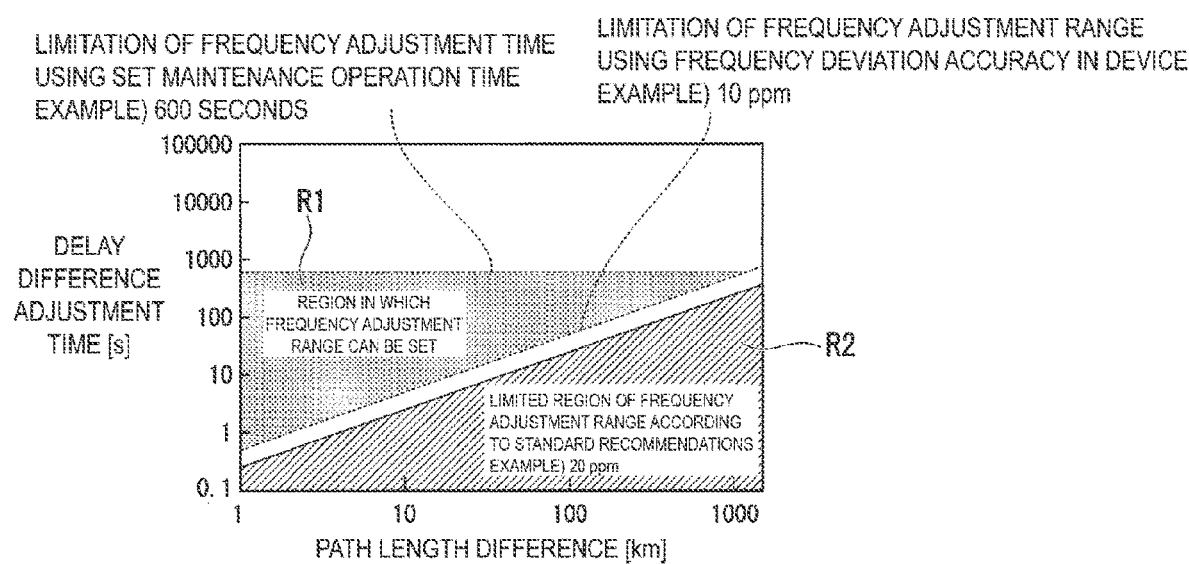
FIG. 14 is a diagram illustrating a relationship between a path length difference and a delay difference adjustment time according to the fourth embodiment.

FIG. 14 is a diagram illustrating a relationship between the path length difference and the delay difference adjustment time. FIG. 14 shows a case in which a frequency adjustment time is limited to 600 [s] by a set maintenance operation time, a frequency adjustment range is limited to 10 [ppm] by the frequency deviation accuracy, and the frequency adjustment range is 20 [ppm] according to standard recommendations as an example. A region R1 indicates a region in which the frequency adjustment range can be set, and a region R2 indicates a region in which the frequency adjustment range is limited. When the path length difference is larger, a time required for delay difference adjustment is longer.

FIFTH EMBODIMENT

In the first, third and fourth embodiments, a clock generator is provided in the CU and the LU. In the fifth embodiment, a clock generator is included in the main board, and a clock source in the apparatus is supplied from the main board and shared. Hereinafter, a difference between the fifth embodiment and the first embodiment will be mainly described, but this difference can also be applied to the third and fourth embodiments.

Figure 15:
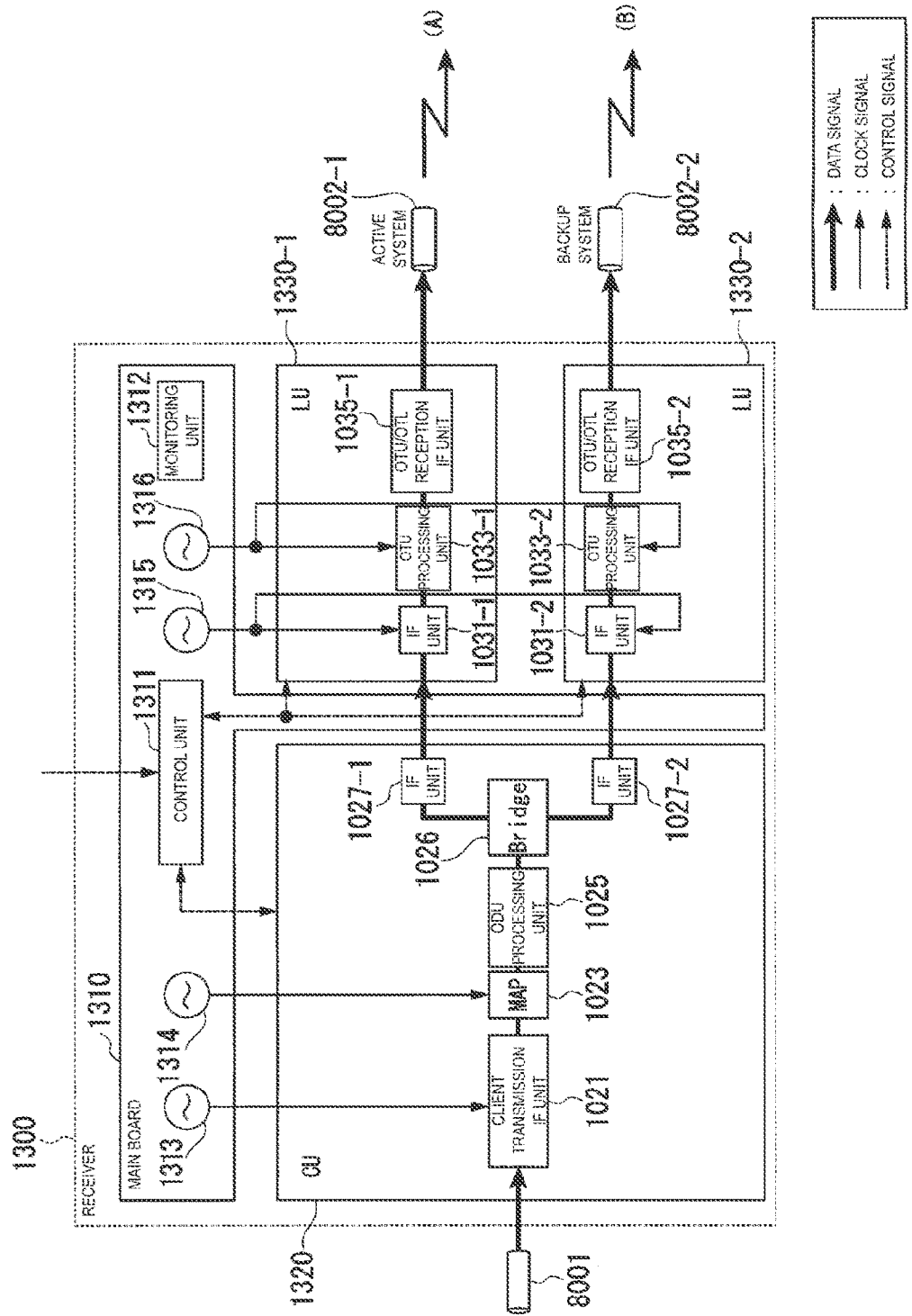
FIG. 15 is a configuration diagram of a transmitter according to a fifth embodiment.

FIG. 15 is a configuration diagram of a transmitter 1300 according to the present embodiment. In FIG. 15, parts the same as those of the transmitter 1000 of the first embodiment illustrated in FIG. 3 are denoted by the same reference signs, and description thereof will be omitted. The transmitter 1300 includes a main board 1310, a CU 1320, and two LUs 1330. The transmitter 1300 has a pluggable configuration. That is, the CU 1320 and the LU 1330 are units that can be attached to and detached from the main board 1310. Hereinafter, the LU 1330 connected to the transmission line 8002-$i$ (i =1, 2) will be described as an LU 1330-$i$.

The main board 1310 includes a control unit 1311, a monitoring unit 1312, and clock generators 1313, 1314, 1315, and 1316. The control unit 1311 controls the CU 1320 and the LU 1330. The monitoring unit 1312 monitors the CU 1320 and the LU 1330 and performs, for example, detection of the occurrence of a failure.

The CU 1320 differs from the CU 1020 of the first embodiment in that the CU 1320 does not include the clock generators 1022 and 1024, that the client reception IF unit 1021 receives the clock signal from the clock generator 1313, and that the mapping unit 1023 receives the clock signal from the clock generator 1314.

The LU 1330-$i$ (i=1, 2) differs from the LU 1030-$i$ of the first embodiment in that the LU 1330-$i$ does not include the clock generators 1032-$i$ and 1034-$i$, and that the IF unit 1031-$i$ receives the clock signal from the clock generator 1315, and that the OTU processing unit 1033-$i$ receives the clock signal from the clock generator 1316.

Figure 16:
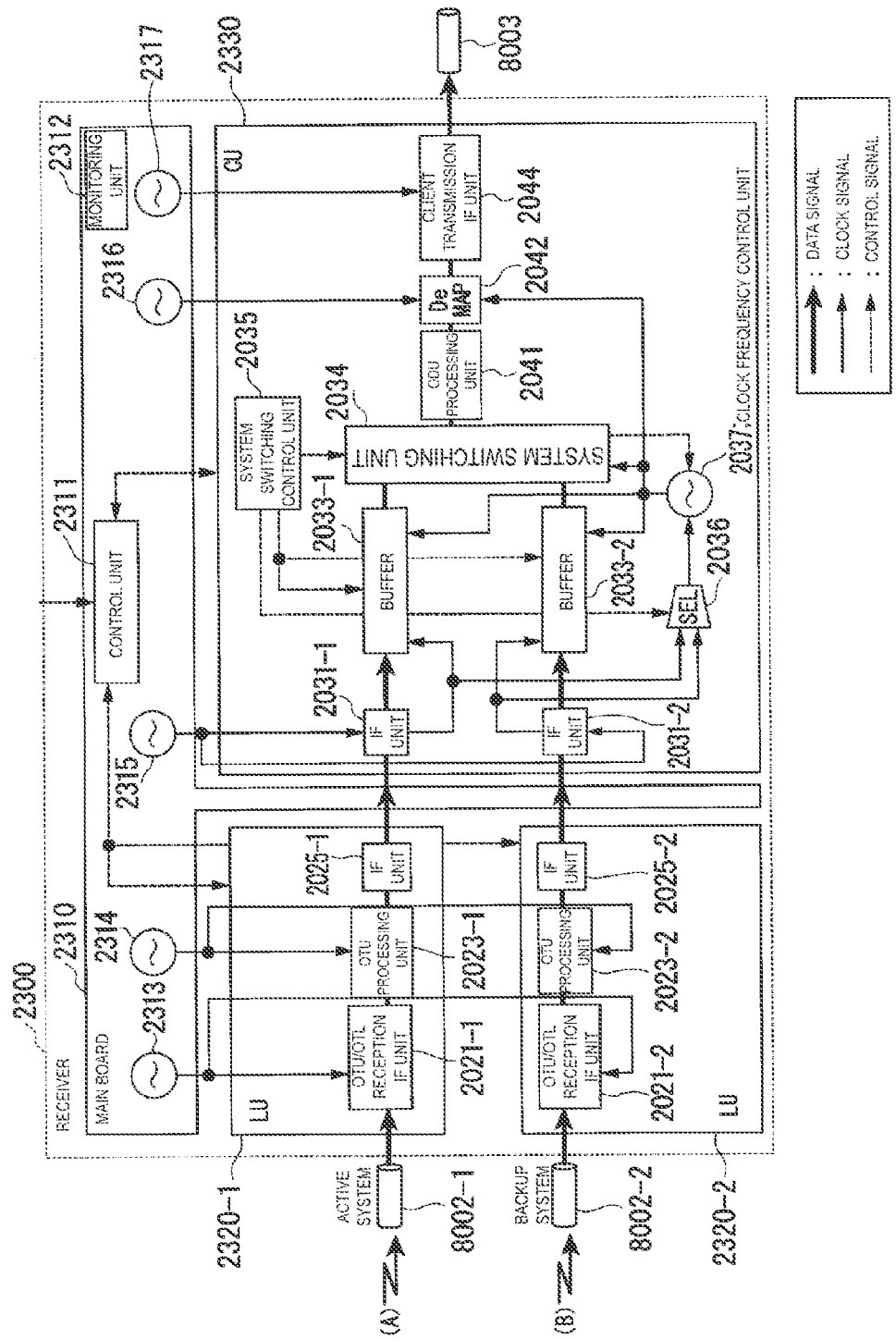
FIG. 16 is a configuration diagram of a receiver according to the fifth embodiment.

FIG. 16 is a configuration diagram of the receiver 2300 according to the present embodiment. In FIG. 16, parts the same as those of the receiver 2000 of the first embodiment illustrated in FIG. 4 are denoted by the same reference signs, and description thereof will be omitted. The receiver 2300 includes a main board 2310, two LUs 2320, and a CU 2330. The receiver 2300 has a pluggable configuration. That is, the LU 2320 and the CU 2330 are units that can be attached to and detached from the main board 2310. Hereinafter, the LU 2320 connected to the transmission line 8002-$i$ (i=1, 2) will be described as an LU 2320-$i$.

The main board 2310 includes a control unit 2311, a monitoring unit 2312, and clock generators 2313, 2314, 2315, 2316, and 2317. The control unit 2311 controls the LU 2320 and the CU 2330. The monitoring unit 2312 monitors the LU 2320 and the CU 2330 and performs, for example, detection of the occurrence of a failure.

The LU 2320-$i$ (i=1, 2) differs from the LU 2020-$i$ of the first embodiment in that the LU 2320-$i$ does not include the clock generator 2022-$i$ and the clock generator 2024-$i$, that the OTU/OTL reception IF unit 2021-$i$ receives the clock signal from the clock generator 2313, and that the OTU processing unit 2023-$i$ receives the clock signal from the clock generator 2314.

The CU 2330 differs from the CU 2030 of the first embodiment in that the CU 2330 does not include the clock generators 2032-1, 2032-2, 2043, and 2045, that the IF units 2031-1 and 2031-2 receive the clock signal from the clock generator 2315, that the demapping unit 2042 receives the clock signal from the clock generator 2316, and that the client transmission IF unit 2044 receives the clock signal from the clock generator 2317.

SIXTH EMBODIMENT

In a sixth embodiment, one non-instantaneous interruption switching device includes a transmission unit and a reception unit.

Figure 17:
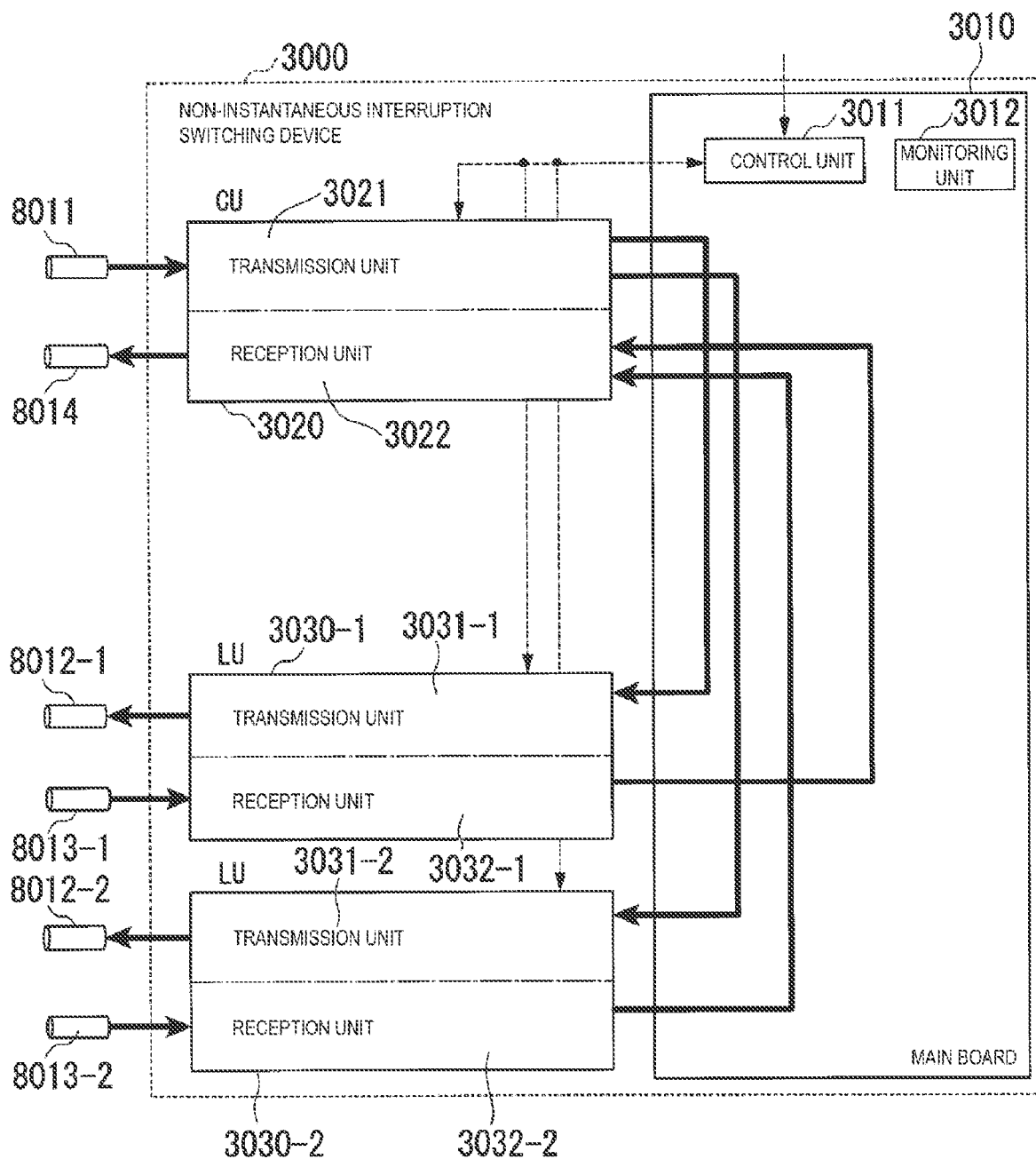
FIG. 17 is a configuration diagram of a non-instantaneous interruption switching device according to a sixth embodiment.

FIG. 17 is a configuration diagram of a non-instantaneous interruption switching device 3000 according to the sixth embodiment. The non-instantaneous interruption switching device 3000 includes a main board 3010, a CU 3020, and two LUs 3030. The two LUs 3030 are described as an LU 3030-1 and 3030-2. The CU 3020 and the LU 3030 can be attached to or detached from the main board 3010. The non-instantaneous interruption switching device 3000 further includes a power supply, a fan, a CPU, and an external clock input and output, but description thereof will be omitted in FIG. 17 for simplicity.

The main board 3010 includes a control unit 3011 and a monitoring unit 3012. The control unit 3011 controls the CU 3020 and the LU 3030. The monitoring unit 3012 monitors the CU 3020 and the LU 3030 and performs, for example, detection of the occurrence of a failure.

The CU 3020 includes a transmission unit 3021 and a reception unit 3022. The CU 1020 (FIG. 3) and the CU 2030 (FIG. 4) of the first embodiment, the CU 1220 (FIG. 11) and the CU 2230 (FIG. 12) of the third embodiment, or the CU 1320 (FIG. 15) and the CU 2330 (FIG. 16) of the fourth embodiment can be used as the transmission unit 3021 and the reception unit 3022. When the CU 1320 (FIG. 15) and the CU 2330 (FIG. 16) are used for the transmission unit 3021 and the reception unit 3022, the main board 3010 includes a clock generator.

An LU 3030-$i$ (i=1, 2) includes a transmission unit 3031-$i$ and a reception unit 3032-$i$. The LU 1030-$i$ (FIG. 3) and the LU 2020-$i$ (FIG. 4) of the first embodiment, the LU 1230-$i$ (FIG. 11) and the LU 2220-$i$ (FIG. 12) of the third embodiment, or the LU 1330-$i$ (FIG. 15) and the LU 2320-$i$ (FIG. 16) of the fourth embodiment can be used as the transmission unit 3031-$i$ and the reception unit 3032-$i$. When the LU 1330-$i$ and the LU 2320-$i$ are used for the transmission unit 3031-$i$ and the reception unit 3032-$i$, the main board 3010 includes a clock generator.

The transmission unit 3021 receives a client signal from the transmission line 8011, and outputs an ODU4 frame (data) in which the client signal has been set, to the transmission units 3031-1 and 3031-2. The transmission unit 3031-$i$ (i=1, 2) outputs an OTU4 signal generated based on the data received from the transmission unit 3021 to the transmission line 8012-$i$. The reception unit 3032-$i$ (i=1, 2)

receives the OTU4 signal from the transmission line 8013-$i$, and outputs a frame signal (data) restored from the OTU4 signal to the reception unit 3022. The reception unit 3022 outputs the client signal obtained from the frame signal to the transmission line 8014.

SEVENTH EMBODIMENT

In the present embodiment, one non-instantaneous interruption switching device includes a transmission unit and a reception unit. In the sixth embodiment, the client unit is not duplicated, but in the seventh embodiment, the CU is duplicated.

Figure 18:
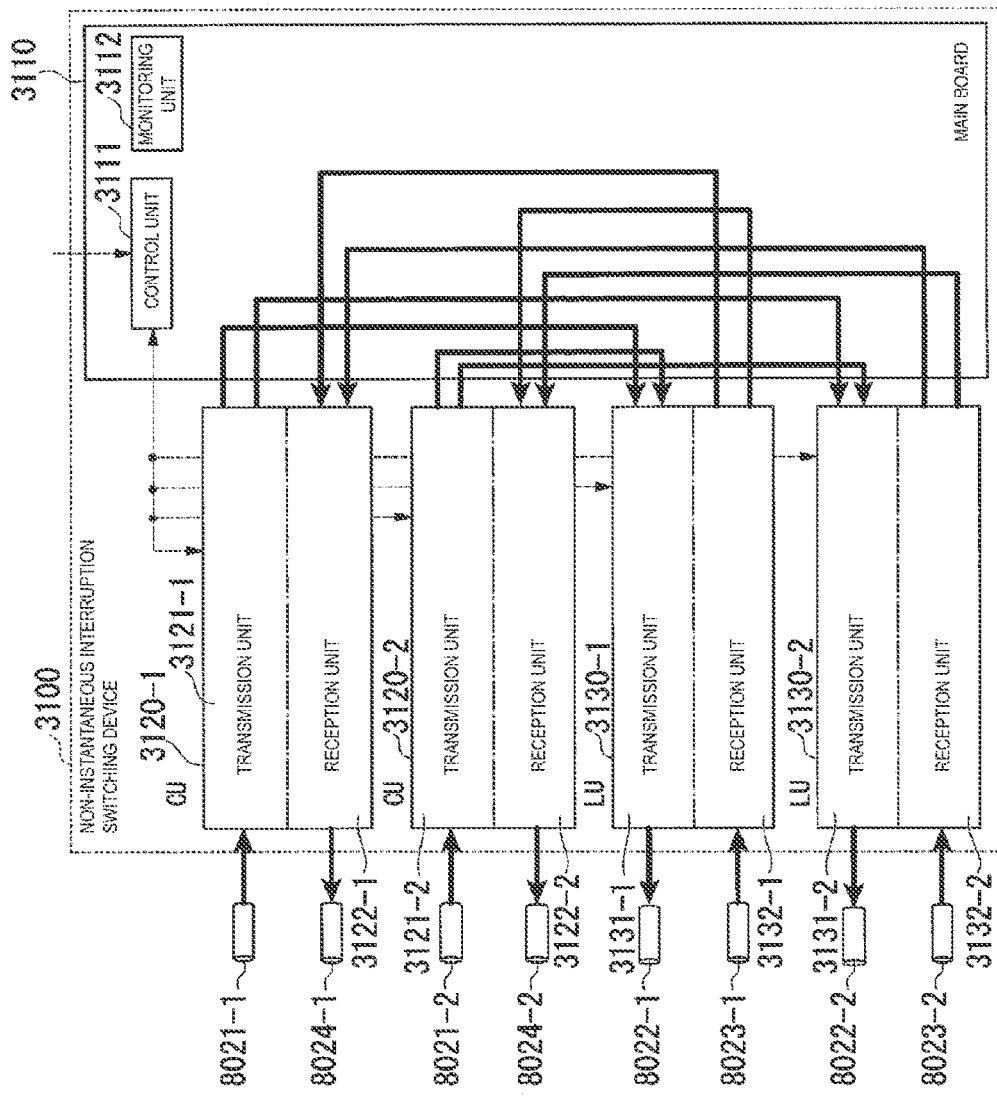
FIG. 18 is a configuration diagram of a non-instantaneous interruption switching device according to a seventh embodiment.

FIG. 18 is a configuration diagram of a non-instantaneous interruption switching device 3100 according to the seventh embodiment. The non-instantaneous interruption switching device 3100 includes a main board 3110, two CUs 3120, and two LUs 3130. The two CUs 3120 are described as CUs 3120-1 and 3120-2, and the two LUs 3130 are described as LUs 3130-1 and 3130-3. The CU 3120 and the LU 3130 can be attached to or detached from the main board 3110. The non-instantaneous interruption switching device 3100 further includes a power supply, a fan, a CPU, and an external clock input and output, but description thereof will be omitted in FIG. 18 for simplicity.

The main board 3110 includes a control unit 3111 and a monitoring unit 3112. The control unit 3111 controls the CU 3120 and the LU 3130. The monitoring unit 3112 monitors the CU 3120 and the LU 3130 and performs, for example, detection of the occurrence of a failure. The CU 3120-$i$ ($i$=1, 2) includes a transmission unit 3121-$i$ and a reception unit 3122-$i$. The LU 3130-$i$ ($i$=1, 2) includes a transmission unit 3131-$i$ and a reception unit 3132-$i$.

The transmission unit 3121-$i$ ($i$=1, 2) receives the client signal from the transmission line 8021-$i$, and outputs an ODU4 frame in which the client signal has been set, to the transmission units 3131-1 and 3131-2. The transmission unit 3131-$i$ ($i$=1, 2) selects the ODU4 frame input from the CU 3120-1 or the ODU4 frame input from the CU 3120-2, and outputs an OTU4 signal generated using the selected ODU4 frame to the transmission line 8022-$i$.

The reception unit 3132-$i$ ($i$=1, 2) receives the OTU4 signal from the transmission line 8023-$i$, and outputs the frame signal restored from the OTU4 signal to the reception units 3122-1 and 3122-2. The reception unit 3122-$i$ ($i$=1, 2) selects the frame signal input from the reception unit 3132-1 or the frame signal input from the reception unit 3132-2, and outputs the client signal obtained from the selected frame signal to the transmission line 8024-$i$.

Figure 19:
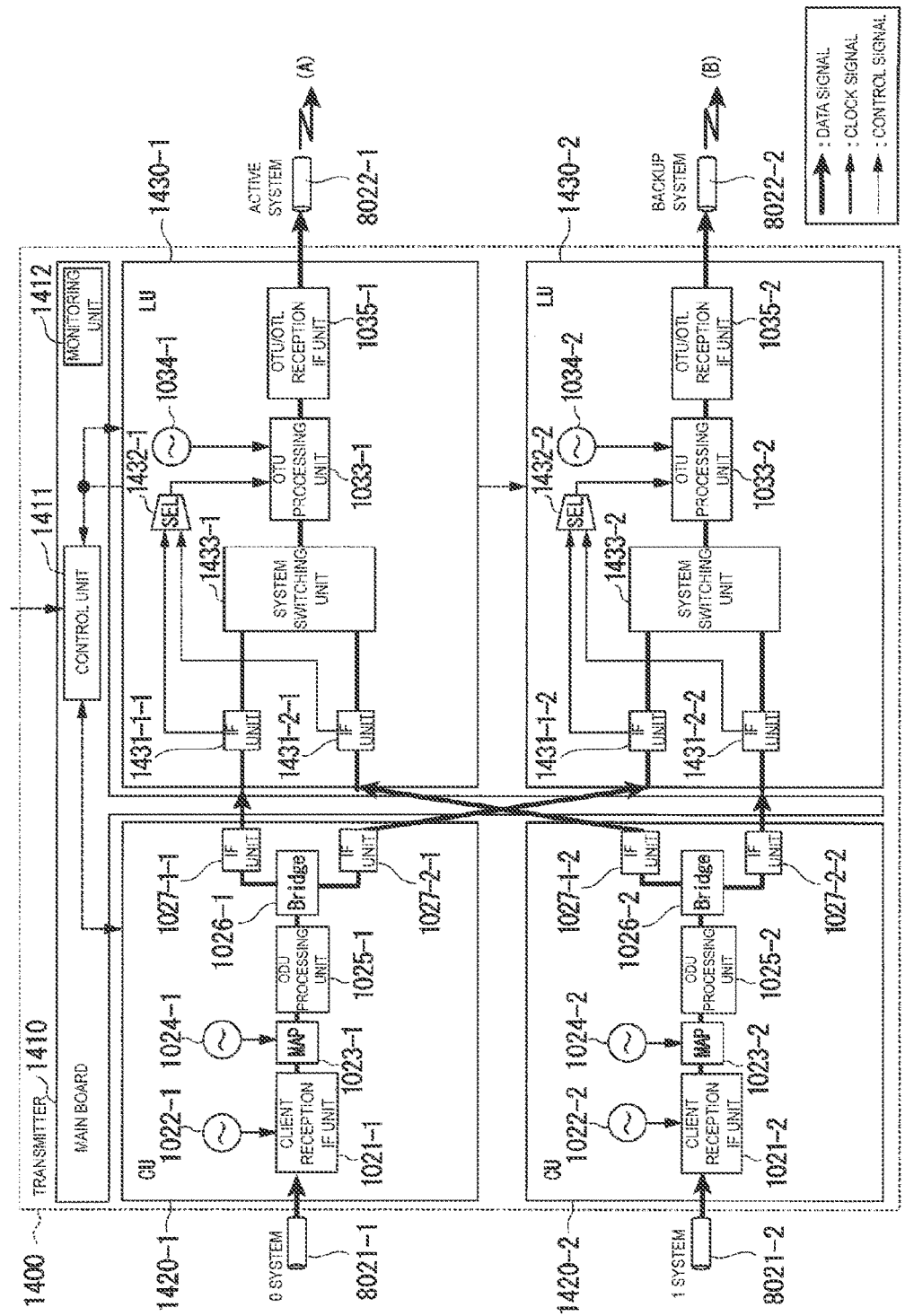
FIG. 19 is a configuration diagram of a transmitter according to the seventh embodiment.

FIG. 19 is a configuration diagram of a transmitter 1400 including a redundant CU. In FIG. 19, parts the same as those of the transmitter 1000 according to the first embodiment illustrated in FIG. 3 are denoted by the same reference signs, and description thereof will be omitted. The transmitter 1400 includes a main board 1410, two CUs 1420, and two LUs 1430. The CU 1420 and the LU 1430 are units that can be attached to and detached from the main board 1410. Hereinafter, the CU 1420 connected to the transmission line 8021-$i$ ($i$=1, 2) will be described as a CU 1420-$i$. For example, the transmission line 8021-1 is a 0 system, and the transmission line 8021-2 is a 1 system. The LU 1430 connected to the transmission line 8022-$i$ ($i$=1, 2) is described as an LU 1430-$i$. For example, the transmission line 8022-1 is an active system and the transmission line 8022-2 is a backup system. The CU 1420-$i$ ($i$=1, 2) is used as the transmission unit 3121-$i$ of the non-instantaneous interruption switching device 3100, and the LU 1430-$i$ ($i$=1, 2) is used as the transmission unit 3131-$i$ of the non-instantaneous interruption switching device 3100.

The main board 1410 includes a control unit 1411 and a monitoring unit 1412. The control unit 1411 controls the CU 1420 and the LU 1430. The monitoring unit 1412 monitors the CU 1420 and the LU 1430 and performs, for example, detection of the occurrence of a failure.

The CU 1420-$i$ ($i$=1, 2) includes a client reception IF unit 1021-$i$, a clock generator 1022-$i$, a mapping unit 1023-$i$, a clock generator 1024-$i$, an ODU processing unit 1025-$i$, a bridge 1026-$i$, and IF units 1027-1-$i$ and 1027-2-$i$. The client reception IF unit 1021-$i$, the clock generator 1022-$i$, the mapping unit 1023-$i$, the clock generator 1024-$i$, the ODU processing unit 1025-$i$, the bridge 1026-$i$, and the IF units 1027-1-$i$ and 1027- 2-$i$ are the same as the client reception IF unit 1021, the clock generator 1022, the mapping unit 1023, the clock generator 1024, the ODU processing unit 1025, and the bridge 1026 illustrated in FIG. 3, respectively. The IF unit 1027-1-$i$ outputs an ODU4 frame output from the bridge 1026-$i$ to the LU 1430-1. The IF unit 1027-2-$i$ outputs an ODU4 frame output from the bridge 1026-$i$ to the LU 1430-2.

The LU 1430-$i$ ($i$=1, 2) differs from the LU 1030-$i$ of the first embodiment in that the LU 1430-$i$ includes IF units 1431-1-$i$ and 1431-2-$i$, a selector unit 1432-$i$, and a system switching unit 1433-$i$, instead of the IF unit 1031-$i$ and the clock generator 1032-$i$. The IF unit 1431-1-$i$ receives the ODU4 frame output by the CU 1420-1. The IF unit 1431-1-$i$ outputs the received frame to the system switching unit 1433-$i$, and outputs a clock signal reproduced based on the received frame to the selector unit 1432-$i$. The IF unit 1431-2-$i$ receives the ODU4 frame output by the CU 1420-2. The IF unit 1431-2-$i$ outputs the received frame to the system switching unit 1433-$i$, and outputs a clock signal reproduced based on the received frame to the selector unit 1432-$i$.

The selector unit 1432-$i$ ($i$=1, 2) outputs the clock signal output by the IF unit 1431-1-$i$ to the OTU processing unit 1033-$i$ when the 0 system is selected, and outputs the clock signal output by the IF unit 1431-2-$i$ to the OTU processing unit 1033-$i$ when the 1 system is selected. The system switching unit 1433-$i$ outputs the ODU4 frame output by the IF unit 1431-1-$i$ to the OTU processing unit 1033-$i$ when the 0 system is selected, and outputs the ODU4 frame output by the IF unit 1431-2-$i$ to the OTU processing unit 1033-$i$ when the 1 system is selected. The OTU processing unit 1033-$i$ multiplexes the ODU4 frames output by the system switching unit 1433-$i$ to generate an OTU4 frame, and outputs the OTU4 frame to the OTU/OTL transmission IF unit 1035-$i$ according to a timing of a clock signal output by the selector unit 1432-$i$.

Figure 20:
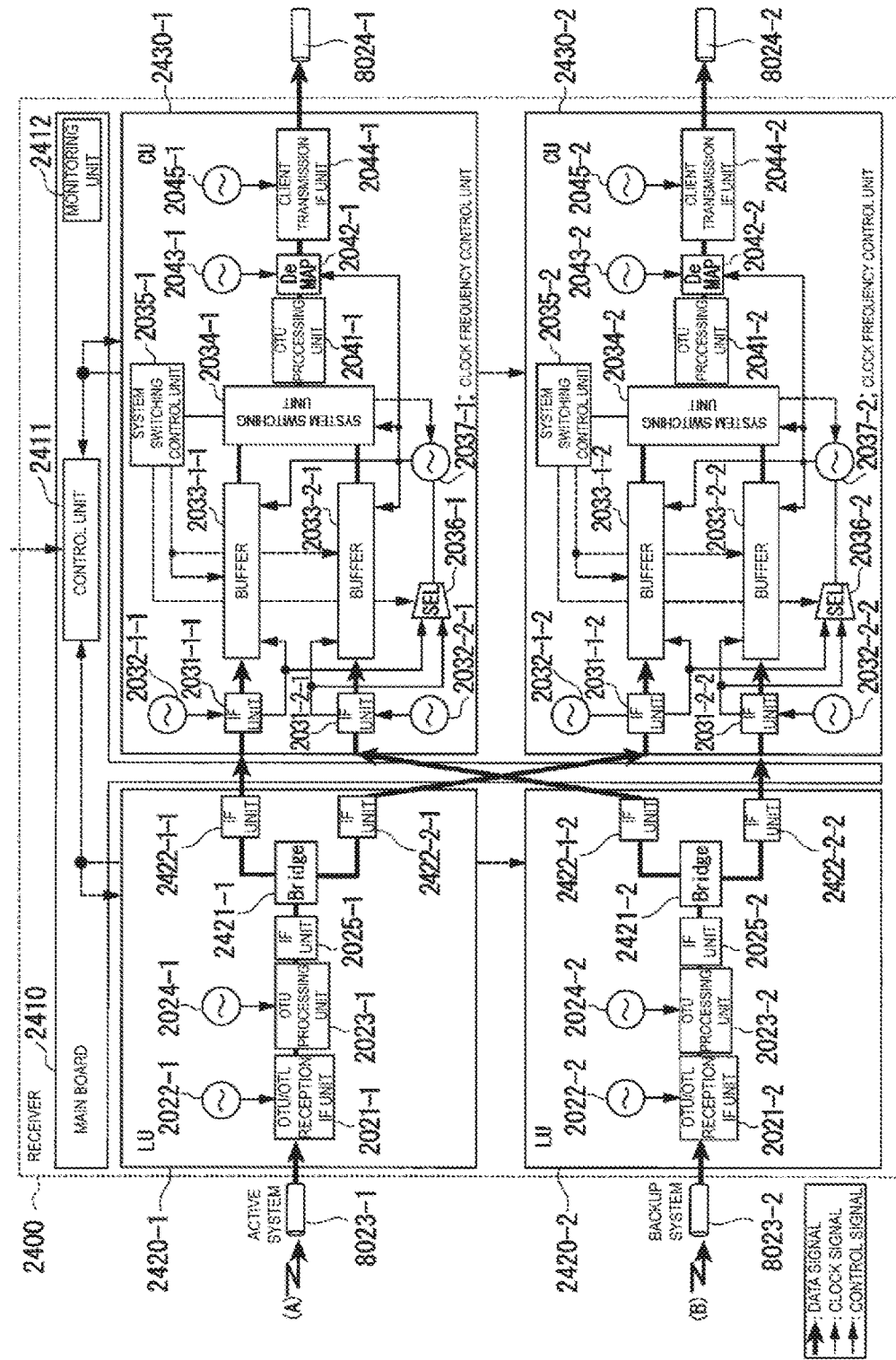
FIG. 20 is a configuration diagram of a receiver according to the seventh embodiment.

FIG. 20 is a configuration diagram of a receiver 2400 with a redundant CU. In FIG. 20, parts the same as those of the receiver 2000 according to the first embodiment illustrated in FIG. 4 are denoted by the same reference signs, and description thereof will be omitted. The receiver 2400 includes a main board 2410, two LUs 2420, and two CUs 2430. The LU 2420 and the CU 2430 are units that can be attached to and detached from the main board 2410. Hereinafter, the LU 2420 connected to the transmission line 8023-$i$ ($i$=1, 2) will be described as an LU 2420-$i$. The transmission line 8023-1 is an active system, and the transmission line 8023-2 is a backup system. The CU 2430 connected to the transmission line 8024-$i$ ($i$=1, 2) is described as a CU 2430-$i$. The transmission line 8024-1 is a 0 system and the transmission line 8024-2 is a 1 system. The LU 2420-$i$ is used as the reception unit 3132-$i$ of the non-instantaneous interruption switching device 3100 illustrated in FIG. 18, and the CU 2430-$i$ is used as the reception unit 3122-$i$ of the non-instantaneous interruption switching device 3100.

The main board 2410 includes a control unit 2411 and a monitoring unit 2412. The control unit 2411 controls the LU 2420 and the CU 2430. The monitoring unit 2412 monitors LU 2430 and CU 2430 and performs, for example, detection of the occurrence of a failure.

The LU 2420-$i$ ($i$=1, 2) differs from the LU 2020-$i$ of the first embodiment in that the LU 2420-$i$ further includes the bridge 2421-$i$ and the IF units 2422-1-$i$ and 2422-2-$i$. The bridge 2421-$i$ outputs a signal frame output by the IF unit 2025-$i$ to the IF units 2422-1-$i$ and 2422-2-$i$. The IF unit 2422-1-$i$ outputs the signal frame to the CU 2430-1, and the IF unit 2422-2-$i$ outputs the signal frame to the CU 2430-2.

The CU 2430-$i$ includes IF units 2031-1-$i$ and 2031-2-$i$, clock generators 2032-1-$i$ and 2032-2-$i$, buffers 2033-1-$i$ and 2033-2-$i$, a system switching unit 2034-$i$, a system switching control unit 2035-$i$, a selector unit 2036-$i$, a clock frequency control unit 2037-$i$, an ODU processing unit 2041-$i$, a demapping unit 2042-$i$, a clock generator 2043-$i$, a client transmission IF unit 2044-$i$, and a clock generator 2045-$i$. The IF units 2031-1-$i$ and 2031-2-$i$, the clock generators 2032-1-$i$ and 2032-2-$i$, the buffer 2033-1-$i$, 2033-2-$i$, the system switching unit 2034-$i$, the system switching control unit 2035-$i$, the selector unit 2036-$i$, the clock frequency control unit 2037-$i$, the ODU processing unit 2041-$i$, the demapping unit 2042-$i$, the clock generator 2043-$i$, the client transmission IF unit 2044-$i$, and the clock generators 2045-$i$ have the same functions as the IF units 2031-1 and 2031-2, the clock generators 2032-1 and 2032-2, the buffers 2033-1 and 2033-2, the system switching unit 2034, the system switching control unit 2035, the selector unit 2036, the clock frequency control unit 2037, the ODU processing unit 2041, the demapping unit 2042, the clock generator 2043, the client transmission IF unit 2044, and the clock generator 2045. However, the IF units 2031-1-$i$ and 2031-2-$i$ receive a signal frame output by the LU 2420-$i$.

EIGHTH EMBODIMENT

The non-instantaneous interruption switching device of the sixth embodiment had a pluggable configuration. The eighth embodiment is a non-instantaneous interruption switching device that does not have a pluggable configuration.

Figure 21:
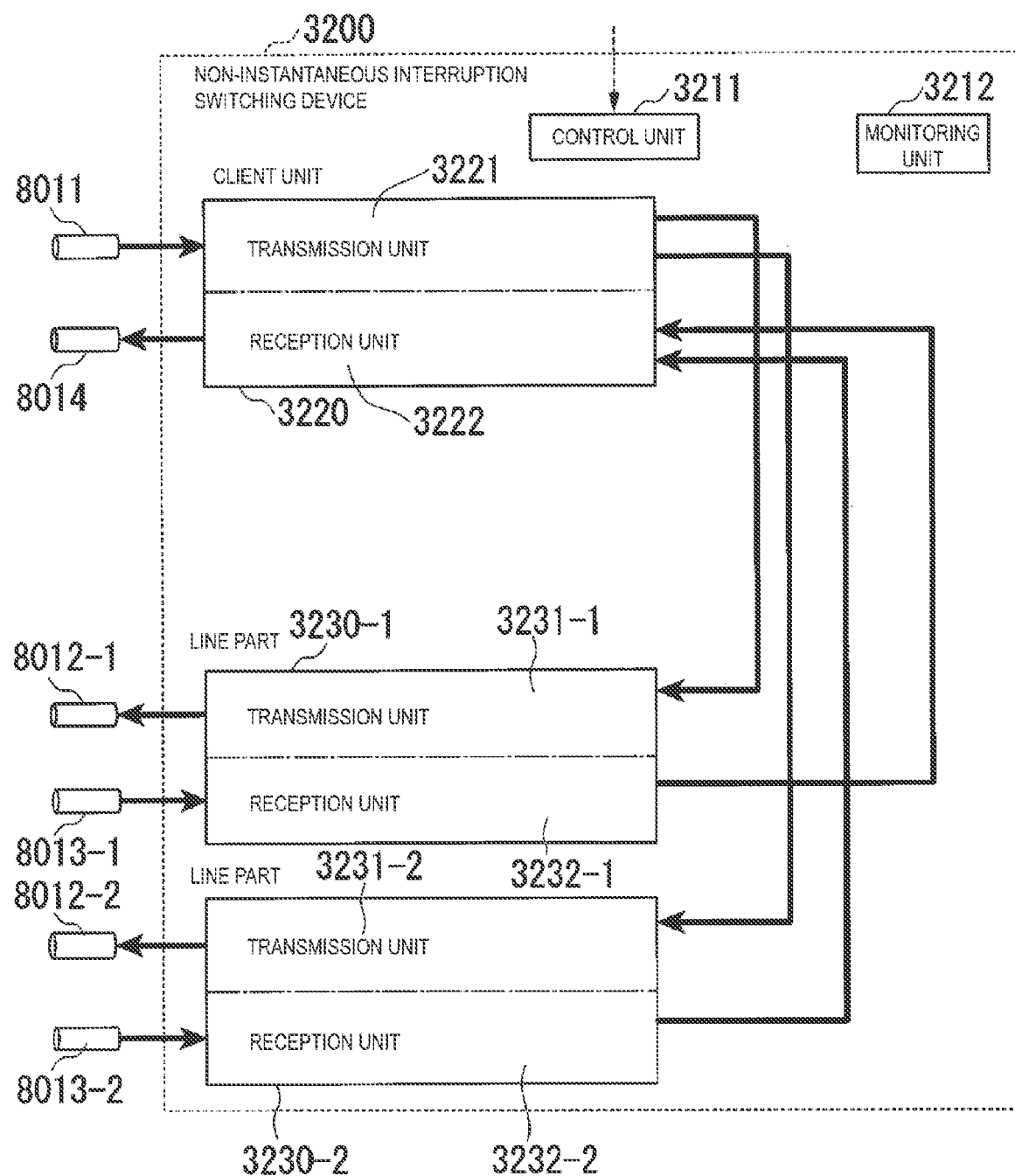
FIG. 21 is a configuration diagram of a non-instantaneous interruption switching device according to an eighth embodiment.

FIG. 21 is a configuration diagram of the non-instantaneous interruption switching device 3200 according to the present embodiment. The non-instantaneous interruption switching device 3200 includes a control unit 3211, a monitoring unit 3212, a client unit 3220, and line parts 3230-1 and 3230-2. The non-instantaneous interruption switching device 3200 further includes a power supply, a fan, a CPU, and an external clock input and output, but description thereof will be omitted in FIG. 21 for simplicity.

The control unit 3211 controls the client unit 3220 and the line parts 3230-1 and 3230-2. The monitoring unit 3212 monitors the client unit 3220 and the line parts 3230-1 and 3230-2 and performs, for example, detection of the occurrence of a failure.

The client unit 3220 includes a transmission unit 3221 and a reception unit 3222. The client unit 1120 (FIG. 9) and the client unit 2130 (FIG. 10) of the second embodiment can be used as the transmission unit 3221 and the reception unit 3222. The LU 3230-$i$ ($i$=1, 2) includes a transmission unit 3231-$i$ and a reception unit 3232-$i$. The OTU processing unit 1033-$i$, the clock generator 1034-$i$, and the OTU/OTL transmission IF unit 1035-$i$ included in the line part 1130 (FIG. 9) of the second embodiment can be used as the transmission unit 3231-$i$. Further, the OTU/OTL reception IF unit 2021-$i$, the clock generator 2022-$i$, the OTU processing unit 2023-$i$, and the clock generator 2024-$i$ included in the line part 2120 (FIG. 10) of the second embodiment can be used as the reception unit 3232-$i$.

The transmission unit 3221 receives the client signal from the transmission line 8011, and outputs an ODU4 frame (data) in which the client signal has been set, to the transmission units 3231-1 and 3231-2. The transmission unit 3231-$i$ ($i$=1, 2) outputs an OTU4 signal generated based on the data received from the transmission unit 3221 to the transmission line 8012-$i$. The reception unit 3232-$i$ ($i$=1, 2) receives the OTU4 signal from the transmission line 8013-$i$ and outputs the frame signal (data) restored from the OTU4 signal to the reception unit 3222. The reception unit 3222 outputs the client signal obtained from the frame signal to the transmission line 8014.

NINTH EMBODIMENT

The seventh embodiment was a pluggable configuration. In a ninth embodiment, a client side is a transmitter, a receiver, and a non-instantaneous interruption switching device having a redundant configuration and not having a pluggable configuration.

Figure 22:
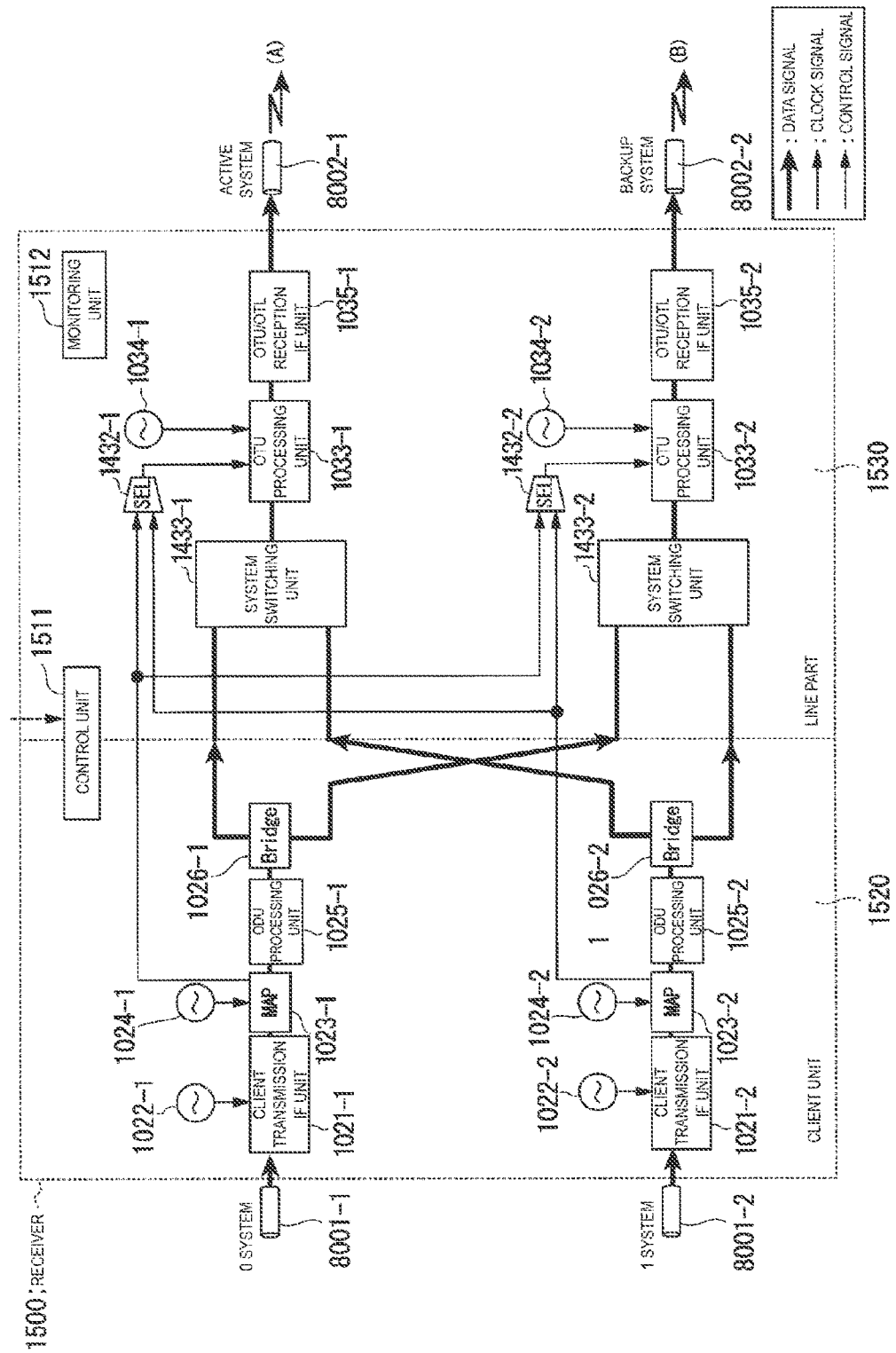
FIG. 22 is a configuration diagram of a transmitter according to a ninth embodiment.

FIG. 22 is a configuration diagram of a transmitter 1500 according to the ninth embodiment. In FIG. 22, parts the same as those of the transmitter 1400 of the seventh embodiment illustrated in FIG. 19 are denoted by the same reference signs, and description thereof will be omitted. The transmitter 1500 includes a control unit 1511, a monitoring unit 1512, a client unit 1520, and a line part 1530. The control unit 1511 controls the client unit 1520 and the line part 1530. The monitoring unit 1512 monitors the client unit 1520 and the line part 1530 and performs, for example, detection of the occurrence of a failure.

The client unit 1520 includes client reception IF units 1021-1 and 1021-2, clock generators 1022-1 and 1022-2, mapping units 1023-1 and 1023-2, clock generators 1024-1 and 1024-2, ODU processing units 1025-1 and 1025-2, and bridges 1026-1 and 1026-2. Further, the line part 1530 includes selector units 1432-1 and 1432-2, system switching units 1433-1 and 1433-2, OTU processing units 1033-1 and 1033-2, clock generators 1034-1 and 1034-2, and OTU/OTL transmission IF units 1035-1 and 1035-2.

With the above configuration, the bridge 1026-1 outputs the ODU4 frame output by the ODU processing unit 1025-1 to the system switching units 1433-1 and 1433-2. Further, the bridge 1026-2 outputs the ODU4 frame output by the ODU processing unit 1025-2 to the system switching units 1433-1 and 1433-2. Further, the mapping unit 1023-$i$ ($i$=1, 2) outputs the clock signal generated based on the mapped signal to the selector units 1432-1 and 1432-2.

Figure 23:
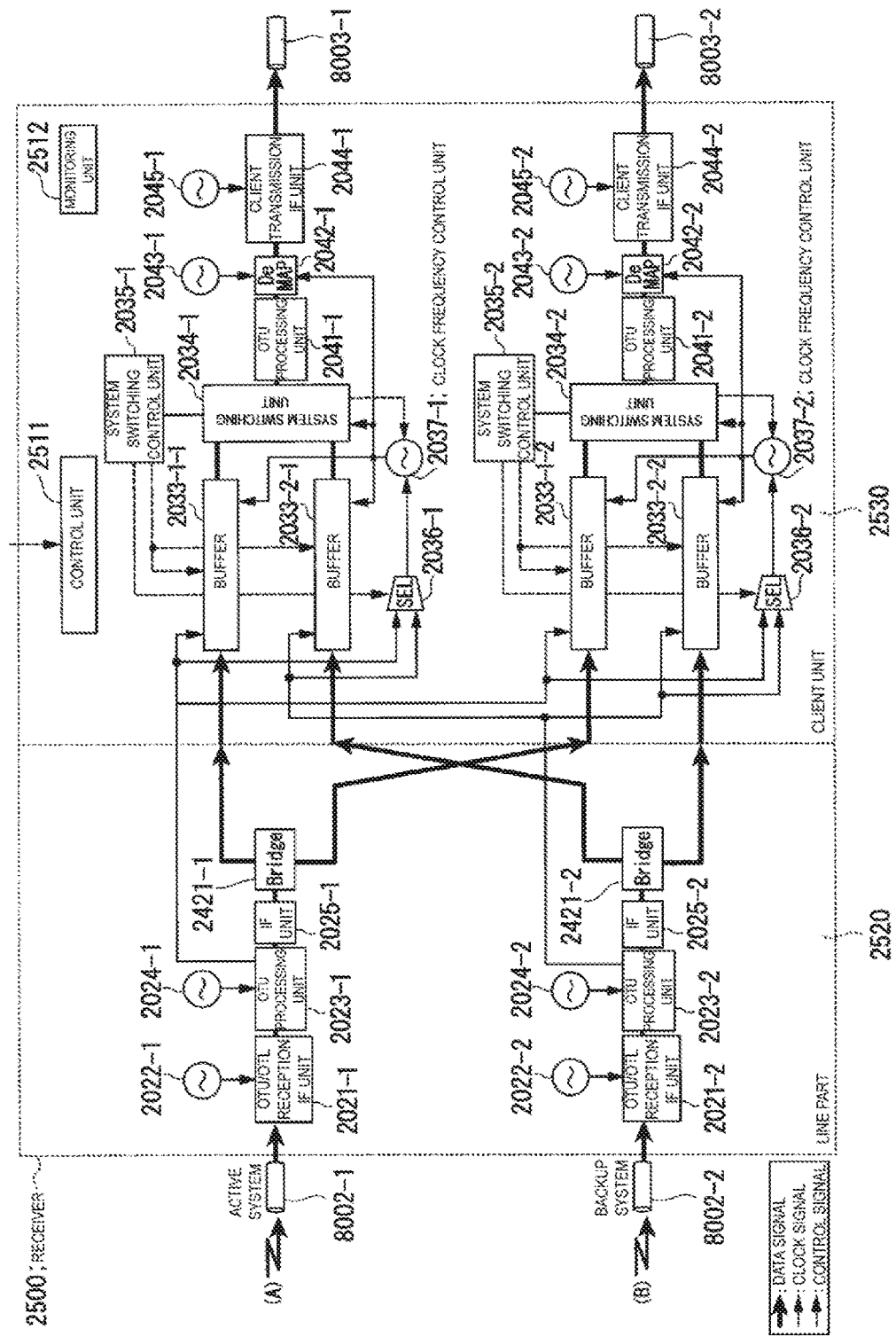
FIG. 23 is a configuration diagram of a receiver according to the ninth embodiment.

FIG. 23 is a configuration diagram of a receiver 2500 according to the present embodiment. In FIG. 23, the same parts as the receiver 2400 of the seventh embodiment illustrated in FIG. 20 are denoted by the same reference signs, and description thereof will be omitted. The receiver 2500 includes a control unit 2511, a monitoring unit 2512, a line part 2520, and a client unit 2530. The control unit 2511 controls the line part 2520 and the client unit 2530. The monitoring unit 2512 monitors the line part 2520 and the client unit 2530 and performs, for example, detection of the occurrence of a failure.

The line part 2520 includes OTU/OTL reception IF units 2021-1 and 2021-2, clock generators 2022-1 and 2022-2, OTU processing units 2023-1 and 2023-2, and clock generators 2024-1 and 2024-2, IF units 2025-1 and 2025-2, and bridges 2421-1 and 2421-2. The client unit 2530 includes buffers 2033-1-1, 2033-2-1, 2033-1-2, and 2033-2-2, system switching units 2034-1 and 2034-2, system switching control units 2035-1 and 2035-2, selector units 2036-1 and 2036-2, clock frequency control units 2037-1 and 2037-2, ODU processing units 2041-1 and 2041-2, demapping units 2042-1 and 2042-2, clock generators 2043-1 and 2043-2, client transmission IF units 2044-1 and 2044-2, and clock generators 2045-1 and 2045-2.

With the above configuration, the bridge 2421-1 outputs a frame signal to the buffers 2033-1-1 and 2033-1-2, and the bridge 2421-2 outputs a frame signal to the buffers 2033-2-1 and 2033-2-2. Further, the OTU processing unit 2023-1 outputs a clock signal generated based on a received signal to the buffers 2033-1-1 and 2033-1-2 and the selector units 2036-1 and 2036-2. The OTU processing unit 2023-2 outputs a clock signal generated based on a received signal to the buffers 2033-2-1 and 2033-2-2 and the selector units 2036-1 and 2036-2.

Figure 24:
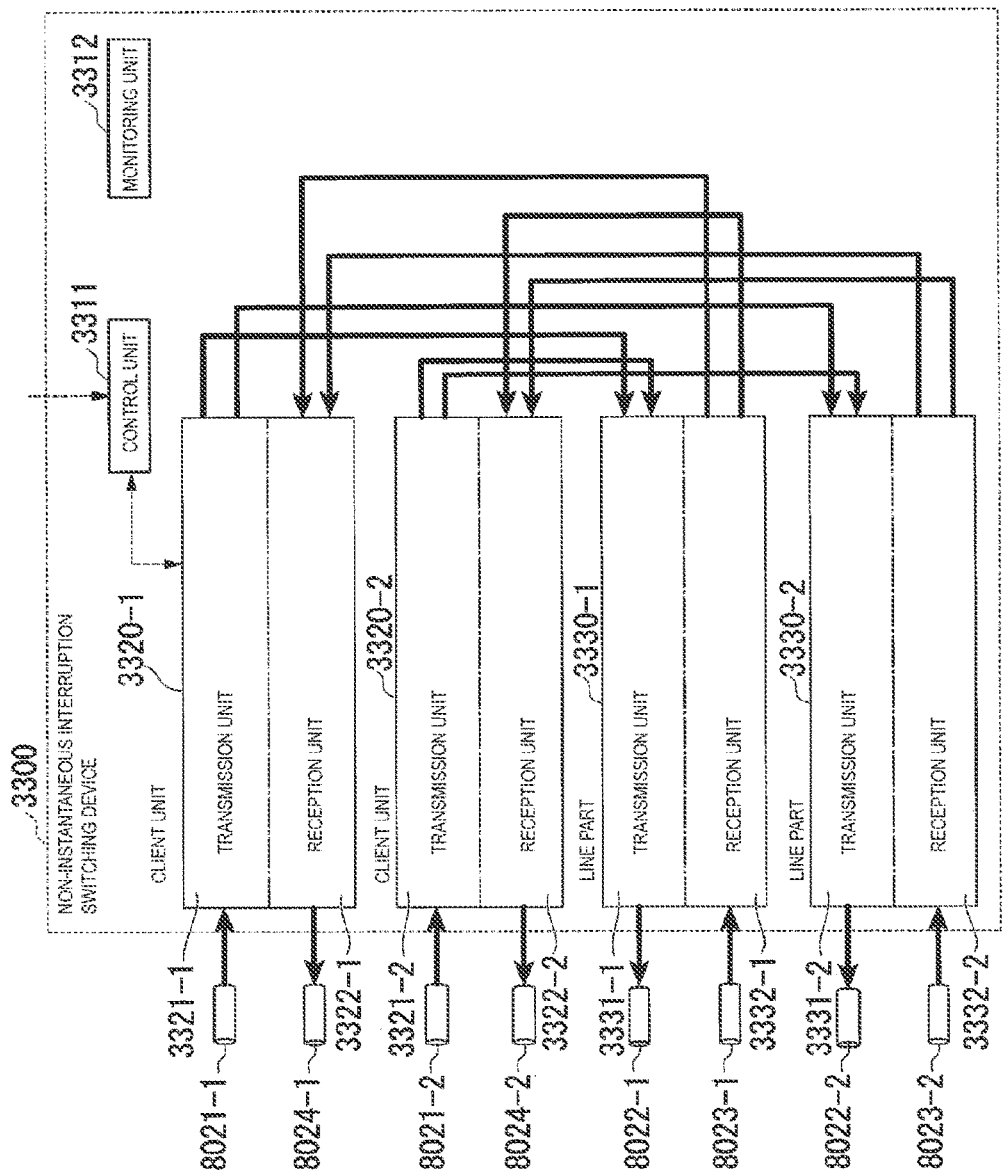
FIG. 24 is a configuration diagram of a non-instantaneous interruption switching device according to the ninth embodiment.

FIG. 24 is a configuration diagram of a non-instantaneous interruption switching device 3300 according to the present embodiment. The non-instantaneous interruption switching device 3300 includes a control unit 3311, a monitoring unit 3312, client units 3320-1 and 3320-2, and line parts 3330-1 and 3330-2. The non-instantaneous interruption switching device 3300 further includes a power supply, a fan, a CPU, and an external clock input and output, but description thereof will be omitted in FIG. 24 for simplicity.

The control unit 3311 controls the client units 3320-1 and 3320-2 and the line parts 3330-1 and 3330-2. The monitoring unit 3312 monitors the client units 3320-1 and 3320-2 and the line parts 3330-1 and 3330-2 and performs, for example, detection of the occurrence of a failure.

The client unit 3320-$i$ (i=1, 2) includes a transmission unit 3321-$i$ and a reception unit 3322-$i$. The client reception IF unit 1021-$i$, the clock generator 1022-$i$, the mapping unit 1023-$i$, the clock generator 1024-$i$, the ODU processing unit 1025-$i$, and the bridge 1026-$i$ included in the client unit 1520 (FIG. 22) can be used as the transmission unit 3321-$i$. The buffers 2033-1-$i$ and 2033-2-$i$, the system switching unit 2034-$i$, the system switching control unit 2035-$i$, the selector unit 2036-$i$, the clock frequency control unit 2037-$i$, the ODU processing unit 2041-$i$, the demapping unit 2042-$i$, the clock generator 2043-$i$, the client transmission IF unit 2044-$i$, and the clock generator 2045-$i$ included in the client unit 2530 (FIG. 23) can be used as the reception unit 3322-$i$.

The line part 3330-$i$ (i=1, 2) includes a transmission unit 3331-$i$ and a reception unit 3332-$i$. The selector unit 1432-$i$, the system switching unit 1433-$i$, the OTU processing unit 1033-$i$, the clock generator 1034-$i$, and the OTU/OTL transmission IF unit 1035-$i$ included in the line part 1530 (FIG. 22) can be used as the transmission unit 3331-$i$. Further, the OTU/OTL reception IF unit 2021-$i$, the clock generator 2022-$i$, the OTU processing unit 2023-$i$, the clock generator 2024-$i$, the IF unit 2025-$i$, and the bridge 2421-$i$ included in the line part 2520 (FIG. 23) can be used as the reception unit 3332-$i$.

The transmission unit 3321-$i$ (i=1, 2) receives a client signal from the transmission line 8021-$i$ and outputs an ODU4 frame (data) in which the client signal has been set, to the transmission units 3331-1 and 3331-2. The transmission unit 3331-$i$ (i=1, 2) selects the data input from the transmission unit 3321-1 or the data input from the transmission unit 3321-2, and outputs an OTU4 signal generated using the selected data to the transmission line 8022-$i$.

The reception unit 3332-$i$ (i=1, 2) receives the OTU4 signal from the transmission line 8023-$i$ and outputs a frame signal restored from the OTU4 signal to the reception units 3322-1 and 3322-2. The reception unit 3322-$i$ (i=1, 2) selects a frame signal input from the reception unit 3332-1 or a frame signal input from the reception unit 3332-2, and outputs a client signal obtained from the selected frame signal to the transmission line 8024-$i$.

TENTH EMBODIMENT

In the present embodiment, a transmission system using the non-instantaneous interruption switching device of the above-described embodiment will be described.

Figure 25:
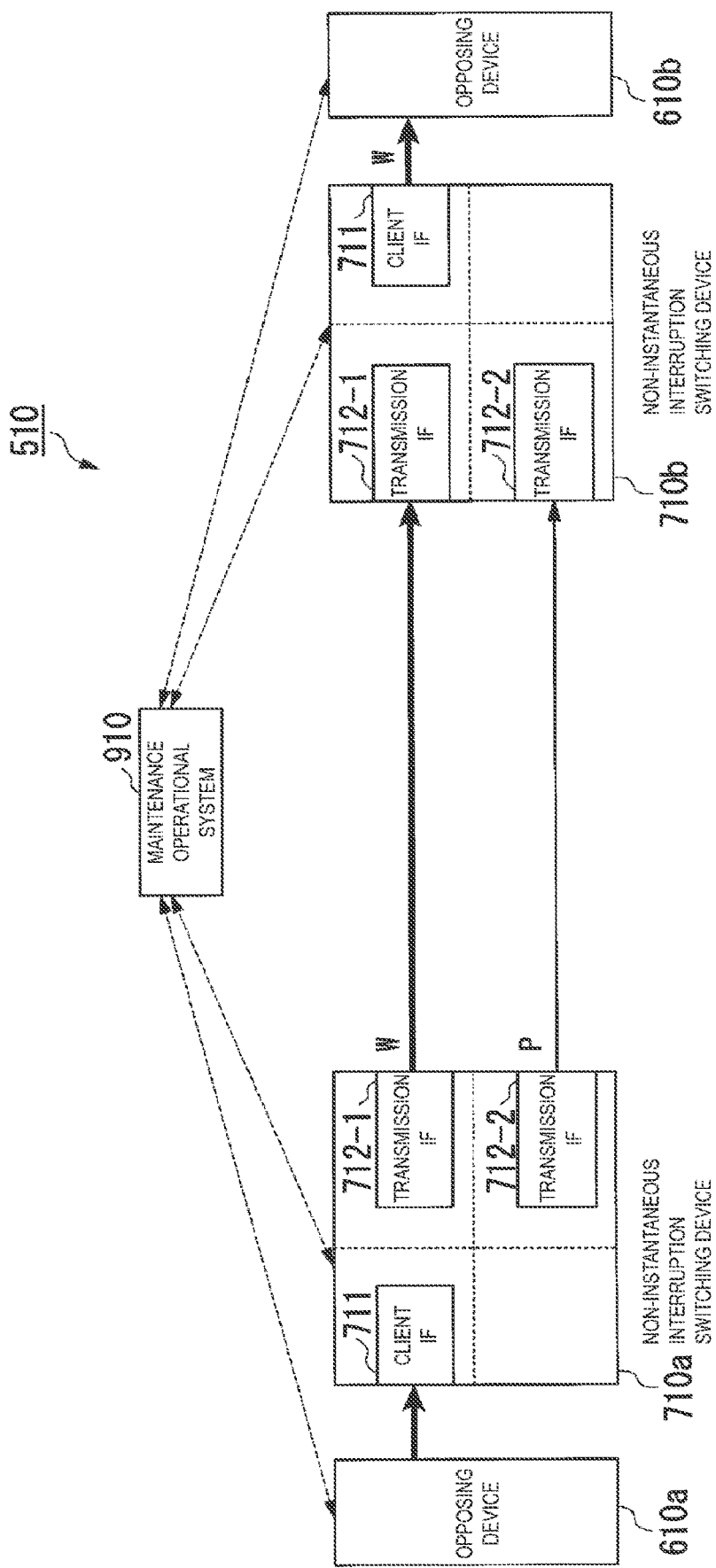
FIG. 25 is a configuration diagram of an optical transmission system according to a tenth embodiment.

FIG. 25 is a configuration diagram of an optical transmission system 510. The optical transmission system 510 includes an opposing device 610, a non-instantaneous interruption switching device 710, and a maintenance operational system 910. The opposing device 610 and the non-instantaneous interruption switching device 710 on the transmission side are described as an opposing device 610$a$ and a non-instantaneous interruption switching device 710$a$, and the opposing device 610 and the non-instantaneous interruption switching device 710 on the reception side are described as an opposing device 610$b$ and a non-instantaneous interruption switching device 710$b$. The maintenance operational system 910 performs monitoring or control of the opposing device 610 and the non-instantaneous interruption switching device 710.

The non-instantaneous interruption switching device 710 includes a client IF 711 and transmission IFs 712-1 and 712-2. The client IF 711 is an IF for transmitting or receiving a client signal to or from the opposing device 610. The transmission IFs 712-1 and 712-2 are IFs for transmitting or receiving an optical signal to or from the other non-instantaneous interruption switching device 710. The transmission IFs 712-1 and 712-2 are IF configurations that enable long-distance transmission such as output of high power light. The transmission IF 712-1 is an active system (W), and the transmission IF 712-2 is a backup system (P). The non-instantaneous interruption switching device 3000 of the sixth embodiment illustrated in FIG. 17 or the non-instantaneous interruption switching device 3200 of the eighth embodiment illustrated in FIG. 21, for example, can be used as the non-instantaneous interruption switching device 710.

When the non-instantaneous interruption switching device 3000 is used as the non-instantaneous interruption switching device 710, the client IF 711 of the non-instantaneous interruption switching device 710$a$ outputs the client signal received from the opposing device 610$a$ to the transmission unit 3021. The transmission IF 712-$i$ (i=1, 2) of the non-instantaneous interruption switching device 710$a$ outputs the optical signal output by the transmission unit 3031-$i$ to the transmission line. The transmission IF 712-$i$ (i=1, 2) of the non-instantaneous interruption switching device 710$b$ outputs the optical signal received from the non-instantaneous interruption switching device 710$a$ to the reception unit 3032-$i$. The client IF 711 of the non-instantaneous interruption switching device 710$b$ outputs the client signal output by the reception unit 3022 to the opposing device 610$b$.

When the non-instantaneous interruption switching device 3200 is used as the non-instantaneous interruption switching device 710, the client IF 711 of the non-instantaneous interruption switching device 710$a$ outputs the client signal received from the opposing device 610a to the transmission unit 3221. The transmission IF 712-i (i=1, 2) of the non-instantaneous interruption switching device 710a outputs the optical signal output by the transmission unit 3231-i to the transmission line. The transmission IF 712-i (i=1, 2) of the non-instantaneous interruption switching device 710b outputs the optical signal received from the non-instantaneous interruption switching device 710a to the reception unit 3232-i. The client IF 711 of the non-instantaneous interruption switching device 710b outputs the client signal output by the reception unit 3222 to the opposing device 610b.

Figure 26:
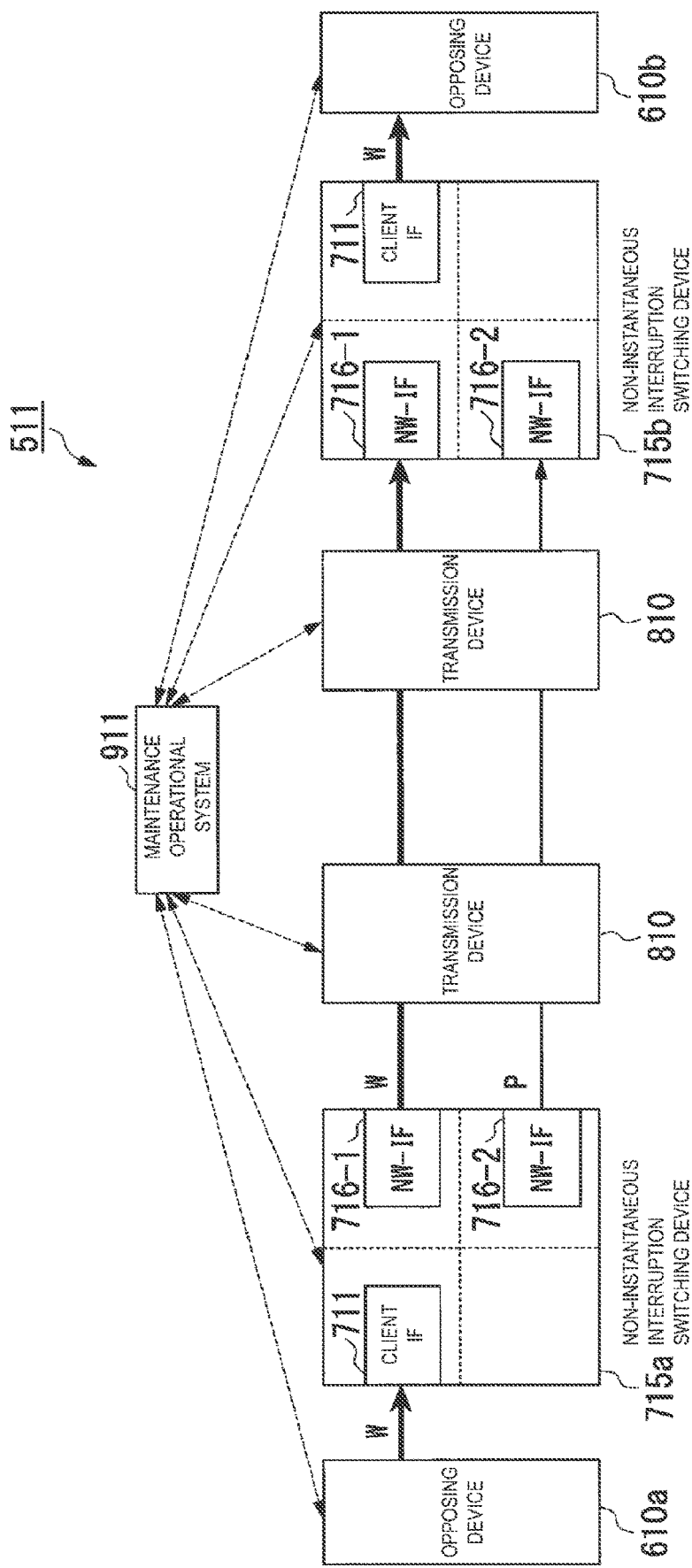
FIG. 26 is a configuration diagram of an optical transmission system according to the tenth embodiment.

FIG. 26 is a configuration diagram of an optical transmission system 511. In FIG. 26, parts the same as those of the optical transmission system 510 illustrated in FIG. 25 are denoted by the same reference signs, and description thereof will be omitted. The optical transmission system 511 includes an opposing device 610, a non-instantaneous interruption switching device 715, a transmission device 810, and a maintenance operational system 911. The non-instantaneous interruption switching device 715 on the transmission side is described as a non-instantaneous interruption switching device 715a, and the non-instantaneous interruption switching device 715 on the reception side is described as a non-instantaneous interruption switching device 715b. One or more transmission devices 810 are included on the transmission line between the non-instantaneous interruption switching device 715a and the non-instantaneous interruption switching device 715b.

The non-instantaneous interruption switching device 715 includes a client IF711 and NW (network)-IFs 716-1 and 716-2. The NW-IFs 716-1 and 716-2 are IF configurations that enable connection between devices without performing long-distance transmission. The non-instantaneous interruption switching device 3000 of the sixth embodiment illustrated in FIG. 17 or the non-instantaneous interruption switching device 3200 of the eighth embodiment illustrated in FIG. 21, for example, can be used as the non-instantaneous interruption switching device 715.

The transmission device 810 is, for example, a transmission apparatus for long-distance transmission such as a wavelength division multiplexing (WDM) transmission apparatus. The transmission device 810 amplifies the received optical signal and outputs the optical signal to a transmission line in a subsequent stage. Thus, because it is not necessary for the transmission IFs 712-1 and 712-2 that output high power light as in the non-instantaneous interruption switching device 710 illustrated in FIG. 25 to be used for the non-instantaneous interruption switching device 715, it is possible to curb a cost. The maintenance operational system 911 performs monitoring or control of the opposing device 610, the non-instantaneous interruption switching device 715, and the transmission device 810.

Figure 27:
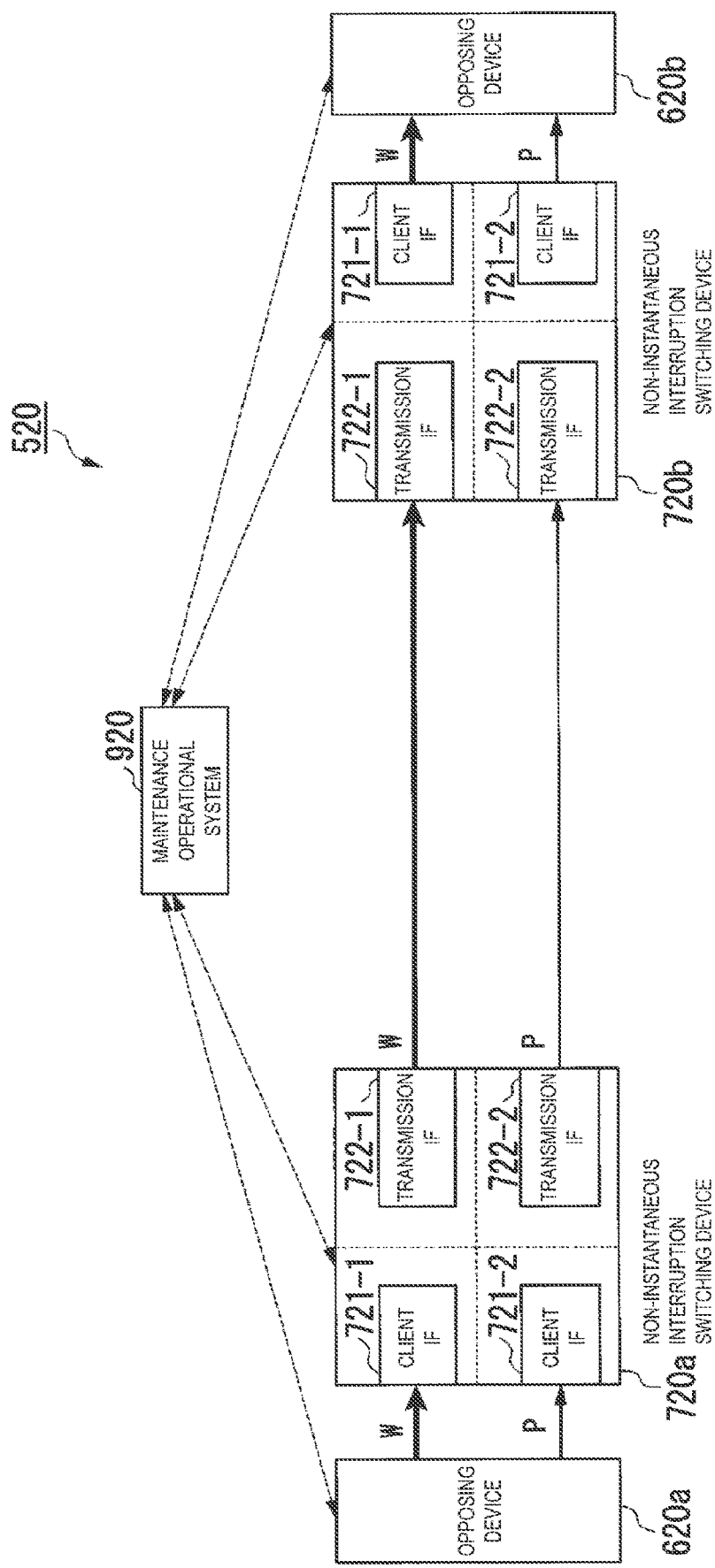
FIG. 27 is a configuration diagram of an optical transmission system according to the tenth embodiment.

FIG. 27 is a configuration diagram of the optical transmission system 520. The optical transmission system 520 includes an opposing device 620, a non-instantaneous interruption switching device 720, and a maintenance operational system 920. The opposing device 620 and the non-instantaneous interruption switching device 720 on the transmission side are described as an opposing device 620a and a non-instantaneous interruption switching device 720a, and the opposing device 620 and the non-instantaneous interruption switching device 720 on the reception side are described as an opposing device 620b and a non-instantaneous interruption switching device 720b. The maintenance operational system 920 performs monitoring or control of the opposing device 620 and the non-instantaneous interruption switching device 720.

The non-instantaneous interruption switching device 720 includes client IFs 721-1 and 721-2 and transmission IFs 722-1 and 722-2. The client IFs 721-1 and 721-2 are IFs for transmitting or receiving a client signal to or from the opposing device 620. The client IF 721-1 is an active system (W), and the client IF 721-2 is a backup system (S). The transmission IFs 722-1 and 722-2 are IFs for transmitting or receiving an optical signal to or from the other non-instantaneous interruption switching device 720. The transmission IF 722-1 is an active system (W), and the transmission IF 722-2 is a backup system (S). The non-instantaneous interruption switching device 3100 of the seventh embodiment illustrated in FIG. 18 or the non-instantaneous interruption switching device 3300 of the ninth embodiment illustrated in FIG. 24, for example, can be used as the non-instantaneous interruption switching device 720.

When the non-instantaneous interruption switching device 3100 is used as the non-instantaneous interruption switching device 720, the client IF 721-i (i=1, 2) of the non-instantaneous interruption switching device 720a outputs the client signal received from the opposing device 620a to the transmission unit 3121-i. The transmission IF 722-i (i=1, 2) of the non-instantaneous interruption switching device 720a outputs the optical signal output by the transmission unit 3131-i to the transmission line. The transmission IF 722-i (i=1, 2) of the non-instantaneous interruption switching device 720b outputs the optical signal received from the non-instantaneous interruption switching device 720a to the reception unit 3132-i. The client IF 721-i of the non-instantaneous interruption switching device 720b outputs the client signal output by the reception unit 3122-i to the opposing device 620b.

When the non-instantaneous interruption switching device 3300 is used as the non-instantaneous interruption switching device 720, the client IF 721-i (i=1, 2) of the non-instantaneous interruption switching device 720a outputs the client signal received from the opposing device 620a to the transmission unit 3321-i. The transmission IF 722-i (i=1, 2) of the non-instantaneous interruption switching device 720a outputs the optical signal output by the transmission unit 3331-i to the transmission line. The transmission IF 722-i (i=1, 2) of the non-instantaneous interruption switching device 720b outputs the optical signal received from the non-instantaneous interruption switching device 720a to the reception unit 3332-i. The client IF 721-i of the non-instantaneous interruption switching device 720b outputs the client signal output by the reception unit 3322-i to the opposing device 620b.

Figure 28:
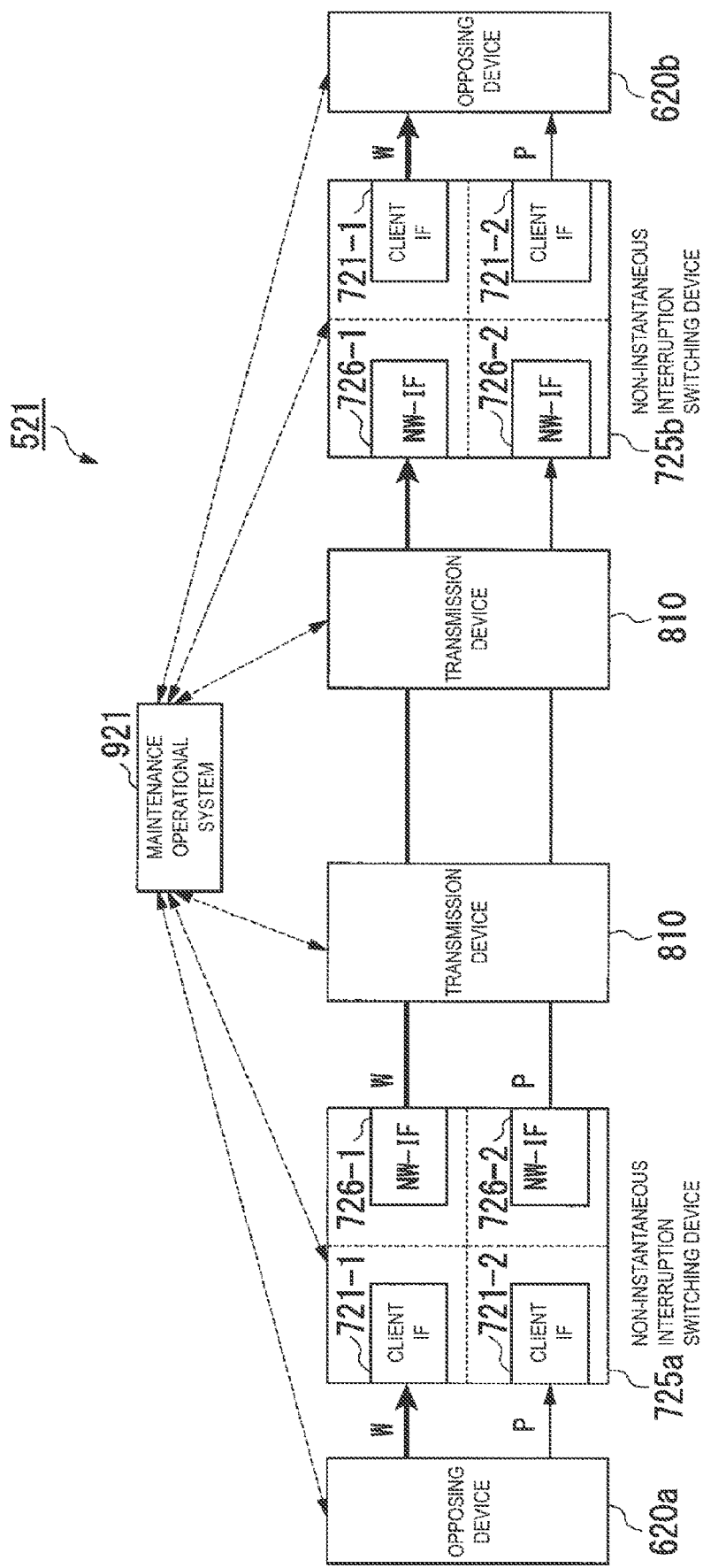
FIG. 28 is a configuration diagram of an optical transmission system according to the tenth embodiment.

FIG. 28 is a configuration diagram of the optical transmission system 521. In FIG. 28, parts the same as those of the optical transmission system 520 illustrated in FIG. 27 are denoted by the same reference signs, and description thereof will be omitted. The optical transmission system 521 includes an opposing device 620, a non-instantaneous interruption switching device 725, a transmission device 810, and a maintenance operational system 921. The non-instantaneous interruption switching device 725 on the transmission side is described as a non-instantaneous interruption switching device 725a, and the non-instantaneous interruption switching device 725 on the reception side is described as a non-instantaneous interruption switching device 725b. One or more transmission devices 810 are included on the transmission line between the non-instantaneous interruption switching device 725a and the non-instantaneous interruption switching device 725b.

The non-instantaneous interruption switching device 725 includes client IFs 721-1 and 721-2 and NW-IFs 726-1 and 726-2. The NW-IFs 726-1 and 726-2 have an IF configuration that enables connection between devices without performing long-distance transmission. The non-instantaneous interruption switching device 3100 of the seventh embodiment illustrated in FIG. 18 or the non-instantaneous interruption switching device 3300 of the ninth embodiment illustrated in FIG. 24, for example, can be used as the non-instantaneous interruption switching device 725.

The transmission device 810 is, for example, a transmission apparatus for long-distance transmission such as a WDM transmission apparatus. The transmission device 810 amplifies the received optical signal and outputs the amplified optical signal to the transmission line in the subsequent stage. Thus, because it is not necessary for the non-instantaneous interruption switching device 720 to use the transmission IFs 722-1 and 722-2 that output high power light as in the non-instantaneous interruption switching device 720 illustrated in FIG. 27, it is possible to curb a cost. The maintenance operational system 921 performs monitoring or control of the opposing device 620, the non-instantaneous interruption switching device 725, and the transmission device 810.

According to the embodiments described above, it is possible to configure the optical transmission apparatus and the optical transmission system so that a frequency range in which a predetermined communication quality can be maintained and a maintenance operation work time can be shortened as much as possible is obtained and so that a tolerance against a device failure is improved. Thus, it is possible to rapidly perform planned non-instantaneous interruption switching while maintaining data transmission with low delay in normal time. Further, it is possible to rapidly perform a non-instantaneous interruption switching setting at the time of a failure and further improve a tolerance to a network failure.

The control units 1011, 1111, 1211, 1311, 1411, 1511, 2011, 2111, 2211, 2311, 2411, 2511, 3011, 3111, 3211, and 3311, and the system switching control units 2035, 2035-1, and 2035-2 include a central processing unit (CPU), a memory, an auxiliary storage device, and the like connected by a bus and execute a program to realize the above functions. All or some of functions of the control units 1011, 1111, 1211, 1311, 1411, 1511, 2011, 2111, 2211, 2311, 2411, 2511, 3011, 3111, 3211, and 3311, the system switching control units 2035, 2035-1, and 2035-2, and the system switching units 2034, 2034-1, and 2034-2 may be realized by using hardware such as an application specific integrated circuit (ASIC), a programmable logic device (PLD), or a field programmable gate array (FPGA). The program may be recorded in a computer-readable recording medium. Further, the program may also be transmitted via a telecommunication line.

Further, functions of the maintenance operational systems 900, 910, 911, 920, and 921 in the embodiments described above may be realized by a computer. In such a case, the maintenance operational systems according to the present invention may be achieved by recording a program for implementing these functions in a computer-readable recording medium, causing a computer system to read the program recorded in the recording medium, and executing the program. Note that the "computer system" as used herein includes an OS and hardware such as a peripheral device. The "computer-readable recording medium" refers to a portable medium such as a flexible disk, a magneto-optical disk, a ROM, and a CD-ROM, and a storage apparatus such as a hard disk installed in a computer system.

According to the embodiments described above, the transmission system includes a transmission apparatus on the transmission side and a transmission apparatus on the reception side connected by a first transmission line and a second transmission line. The transmission apparatus on the transmission side is, for example, the transmitters 1000, 1100, 1200, 1300, 1400, and 1500 and the non-instantaneous interruption switching devices 3000, 3100, 3200, 3300, 710*a*, and 720*a*. The transmission apparatuses on the reception side are, for example, the receivers 2000, 2100, 2200, 2300, 2400, and 2500, and the non-instantaneous interruption switching devices 3000, 3100, 3200, 3300, 710*b*, and 720*b*.

The transmission apparatus on the transmission side includes a transmission processing unit (transmission processor) and a transmission side clock output unit (transmission side clock generator). The transmission processing unit performs a process of transmitting the first signal via the first transmission line and a process of transmitting the second signal having the same content as the first signal via the second transmission line. The transmission side clock output unit outputs a clock signal giving a processing timing to the transmission process.

The transmission apparatus on the reception side includes a first reception processing unit (first reception processor), a second reception processing unit (second reception processor), an output speed control unit (output speed controller), a system switching unit (system switch), an output processing unit (output processor), a reception side clock output unit (reception side clock generator), a clock frequency control unit (clock frequency controller), and a frequency adjustment range calculation unit (frequency adjustment range calculator). The first reception processing unit (first reception processor) receives the first signal transmitted on the first transmission line and performs a process of receiving the first signal. The second reception processing unit (second reception processor) receives the second signal transmitted on the second transmission line and performs a process of receiving the second signal. The output speed control unit (output speed controller) controls a speed at which the first signal on which the first reception processing unit has performed a reception process is output and a speed at which the second signal on which the second reception processing unit has performed a reception process is output. Examples of the output speed control unit include system switching control units (system switching controllers) 2035, 2035-1, and 2035-2. The system switching unit selects and outputs any one of the first signal on which the first reception processing unit has performed a reception process and the second signal on which the second reception processing unit has performed a reception process. The output processing unit performs an output process performs an output process for outputting the first signal or the second signal output by the system switching unit to another apparatus. For example, when the transmission apparatus on the reception side receives the OTU4 signal, the reception process includes a process of receiving the OTU4 signal transmitted on the transmission line by an optical signal and converting the OTU4 signal to an OTL signal of an electric signal, a process of restoring an OTU4 frame from the OTL signal, a process of restoring a frame signal with which the OTU4 frame has been multiplexed, and a process of buffering the restored frame signal and outputting the frame signal using FIFO. The process of buffering the frame signal and outputting the frame signal using FIFO can be regarded as a process of the output speed control unit. Further, the output process includes a process of restoring the ODU signal from the frame signal, a process of demapping the restored ODU signal to extract the client signal, and a process of outputting the client signal to the transmission line.

The reception side clock output unit outputs a clock signal giving a processing timing to each of the first reception processing unit, the second reception processing unit, and the output processing unit. The reception side clock output unit includes not only a clock generator but also a functional unit (for example, the IF units 2031-1 and 2031-2) that reproduces a clock signal from a received signal. The clock frequency control unit adjusts the frequency of the clock signal giving a processing timing to the output processing unit. The frequency adjustment range calculation unit calculates the adjustment range of the frequency at the clock frequency control unit based on the frequency deviation accuracy of the reception side clock output unit, the frequency deviation accuracy of the transmission side clock output unit, and the prescribed value of the frequency deviation. The frequency adjustment range calculation unit may acquire the frequency deviation accuracy measured at the transmission apparatus and the frequency deviation accuracy measured at the other transmission apparatus. The frequency adjustment range calculation unit is, for example, the clock frequency adjustment range calculation unit 2813.

The reception process includes line side signal processing for receiving a signal from the line side, and the output process includes client side signal processing for outputting a received signal to the client side. The transmission apparatus may include a line side signal processing unit that performs line side signal processing of the first reception processing unit and line side signal processing of the second reception processing unit, and a client side signal processing unit that performs client side signal processing of the output processing unit. The client side signal processing unit may have a redundant configuration.

The transmission apparatus may include a line unit, a client unit, and a main board to or from which the line unit and the client unit can be attached or detached. The line unit includes a line side signal processing unit. The client unit includes a client side signal processing unit, an output speed control unit, a system switching unit, an output processing unit, a clock frequency control unit, and a frequency adjustment range calculation unit. The main board includes a part of the reception side clock output unit.

The system switching unit may measure a delay difference between the first signal and the second signal. The frequency adjustment range calculation unit calculates an adjustment range for eliminating the delay difference within the maintenance operation time based on the measured delay difference and the input maintenance operation time.

Further, the transmission apparatus may further include a system switching control unit that selects any one of the system of the first transmission line and the system of the second transmission line and instructs the system switching unit to select the first signal or the second signal received in the selected system. The clock frequency control unit includes a frequency divider that frequency-divides the clock signal giving a processing timing to the output processing unit to adjust the frequency, and a clock adjustment unit that controls a frequency division ratio that the frequency divider uses for frequency division.

The embodiments of the present invention have been described above in detail with reference to the drawings. However, specific configurations are not limited to those embodiments, and include any design or the like within the scope not departing from the gist of the present invention.

REFERENCE SIGNS LIST

110, 120, 710a, 710b, 715a, 715b, 720a, 720b, 725a, 725b, 980, 990 Non-instantaneous interruption switching device
111, 981 Transmission unit
121, 991 Reception unit
122 Frequency adjustment range setting unit
123 Clock frequency adjustment unit
510, 511, 520, 521 Optical transmission system
610a, 610b, 620a, 620b opposing device
711, 721-1, 721-2 Client IF
712-1, 712-2, 722-1, 722-2 Transmission IF
716-1, 716-2, 726-1, 726-2 NW IF
810 Transmission device
900, 910, 911, 920, 921 Maintenance operational system
992 Clock frequency adjustment unit
1000, 1100, 1200, 1300, 1400, 1500 Transmitter
1010, 1210, 1310, 1410 Main board
1011, 1111, 1211, 1311, 1411, 1511 Control unit
1012, 1112, 1212, 1312, 1412, 1512 Monitoring unit
1020, 1220, 1420-1, 1420-2 Client unit
1021, 1021-1, 1021-2 Client reception IF unit
1022, 1022-1, 1022-2 Clock generator
1023, 1023-1, 1023-2 Mapping unit
1024, 1024-1, 1024-2, 1313, 1314, 1315, 1316 Clock generator
1025, 1025-1, 1025-2 ODU processing unit
1026, 1026-1, 1026-2 Bridge
1027-1, 1027-1-1, 1027-1-2, 1027-2, 1027-2-1, 1027-2-2 IF unit
1030, 1230-1, 1230-2, 1330-1, 1330-2, 1430-1, 1430-2 Line unit
1031-1, 1031-2, 1431-1-1, 1431-1-2, 1431-2-1, 1431-2-2 IF unit
1032-1, 1032-2 Clock generator
1033-1, 1033-2 OTU processing unit
1034-1, 1034-2 Clock generator
1035-1, 1035-2 OTU/OTL transmission IF unit
1120, 1520 Client unit
1130, 1530 Line part
1221 Clock frequency deviation measurement unit
1231-1, 1231-2 Clock frequency deviation measurement unit
1432-1, 1432-2 Selector unit
1433-1, 1433-2 System switching unit
2000, 2100, 2200, 2300, 2400, 2500 Receiver
2010, 2210, 2310, 2410 Main board
2011, 2111, 2211, 2311, 2411, 2511 Control unit
2012, 2112, 2212, 2312, 2412, 2512 Monitoring unit
2020-1, 2020-2, 2220-1, 2220-2, 2420-1, 2420-2 Line unit
2021-1, 2021-2 OTU/OTL reception IF unit
2022-1, 2022-2 Clock generator
2023-1, 2023-2 OTU processing unit
2024-1, 2024-2 Clock generator
2025-1, 2025-2, 2031-1, 2031-2, 2031-1-1, 2031-1-2, 2031-2-1, 2031-2-2, 2422-1-1, 2422-1-2,
2422-2-1, 2422-2-2 IF unit
2030, 2230, 2430-1, 2430-2 Client unit
2032-1, 2032-2, 2032-1-1, 2032-1-2, 2032-2-1, 2032-2-2 Clock generator
2033-1, 2033-1-1, 2033-1-2, 2033-2, 2033-2-1, 2033-2-2 Buffer 2034, 2034-1, 2034-2 System switching unit
2035, 2035-1, 2035-2 System switching control unit
2036, 2036-1, 2036-2 Selector unit
2037, 2037-1, 2037-2 Clock frequency control unit
2041, 2041-1, 2041-2 ODU processing unit
2042, 2042-1, 2042-2 Demapping unit
2043, 2043-1, 2043-2 Clock generator
2044, 2044-1, 2044-2 Client transmission IF unit
2045, 2045-1, 2045-2 Clock generator
2120, 2520 Line part
2130, 2530 Client unit
2221-1, 2221-2, 2231 Clock frequency deviation measurement unit
2313, 2314, 2315, 2316, 2317 Clock generator
2421-1, 2421-2 Bridge
2801 Delay difference detection unit
2802 Main signal selector unit
2811 Main signal system switching instruction unit
2812 Reception clock switching instruction unit
2813 Clock frequency adjustment range calculation unit
2814 Clock frequency adjustment accuracy instruction unit
2815 Clock frequency adjustment instruction unit
2821 Clock adjustment unit
2822 Clock frequency adjustment unit
2910, 2921, 2922 Frequency divider
2920 PLL unit
2930 Reference clock generator
2940 Transceiver unit
3000, 3100, 3200, 3300 Non-instantaneous interruption switching device
3010, 3110 Main board
3011, 3111, 3211, 3311 Control unit
3012, 3112, 3212, 3312 Monitoring unit
3020, 3120-1, 3120-2 Client unit
3021, 3031-1, 3031-2, 3121-1, 3121-2, 3131-1, 3131-2, 3221, 3231-1, 3231-2, 3321-1, 3321-2, 3331-1, 3331-2 Transmission unit
3022, 3032-1, 3032-2, 3122-1, 3122-2, 3132-1, 3132-2, 3222, 3232-1, 3232-2, 3322-1, 3322-2, 3332-1, 3332-2 Reception unit
3030-1, 3030-2, 3130-1, 3130-2 Line unit
3220, 3320-1, 3320-2 Client unit
3230-1, 3230-2, 3330-1, 3330-2 Line part
8001, 8002-1, 8002-2, 8003, 8011, 8012-1, 8012-2, 8013-1, 8013-2, 8014, 8021-1, 8021-2, 8022-1, 8022-2, 8023-1, 8023-2, 8024-1, 8024-2 Transmission line

The invention claimed is:

1. A transmission apparatus for switching to output any one of a first signal received from another transmission apparatus via a first transmission line and a second signal received from the other transmission apparatus via a second transmission line, the transmission apparatus comprising:
a first reception processor configured to receive the first signal transmitted on the first transmission line and perform a reception process on the first signal;
a second reception processor configured to receive the second signal transmitted on the second transmission line and perform a reception process on the second signal;
an output speed controller configured to control a speed at which the first signal on which the first reception processor has performed the reception process is output and a speed at which the second signal on which the second reception processor has performed the reception process is output;
a system switch configured to select and output any one of the first signal output by the first reception processor and the second signal output by the second reception processor;
an output processor configured to perform an output process for outputting the first signal or the second signal output by the system switch to another device;
a reception side clock generator configured to output a clock signal giving a processing timing to each of the first reception processor, the second reception processor, and the output processor;
a clock frequency controller configured to adjust a frequency of the clock signal giving the processing timing to the output processor; and
a frequency adjustment range calculator configured to calculate an adjustment range of the frequency at the clock frequency controller based on frequency deviation accuracy of the reception side clock generator, frequency deviation accuracy of a transmission side clock generator that outputs a clock signal giving a processing timing to a process of transmitting the first signal and a process of transmitting the second signal at the other transmission apparatus, and a prescribed value of a frequency deviation,
wherein the frequency adjustment range calculator is configured to
acquire the frequency deviation accuracy of the reception side clock generator measured at the transmission apparatus and the frequency deviation accuracy of the transmission side clock generator measured at the other transmission apparatus,
calculate a maximum value of a positive direction of the adjustment range by decreasing a maximum value of the acquired frequency deviation from a minimum value of a positive direction of the prescribed value of the frequency deviation, and
calculate a maximum value of a negative direction of the adjustment range by decreasing a minimum value of the acquired frequency deviation from a minimum value of a negative direction of the prescribed value of the frequency deviation, and
wherein each of the first reception processor, the second reception processor, the output speed controller, the system switch, the output processor, the reception side clock generator, the clock frequency controller, the frequency adjustment range calculator is implemented by:
i) computer executable instructions executed by at least one processor,
ii) at least one circuitry or
iii) a combination of computer executable instructions executed by at least one processor and at least one circuitry.

2. The transmission apparatus according to claim 1,
wherein the reception process includes line side signal processing for reception of a signal from a line side,
the output process includes client side signal processing for outputting a received signal to a client side, and
the transmission apparatus comprises:
a line side signal processor configured to perform the line side signal processing of the first reception processor and the line side signal processing of the second reception processor; and
a client side signal processor configured to perform the client side signal processing of the output processor, wherein each of the line side signal processor and the client side signal processor is implemented by:
i) computer executable instructions executed by at least one processor,
ii) at least one circuitry or
iii) a combination of computer executable instructions executed by at least one processor and at least one circuitry.

3. The transmission apparatus according to claim 2, comprising:
a line processor;
a client processor; and
a main board to or from which the line processor and the client processor can be attached or detached,
wherein the line processor includes the line side signal processor,
the client processor includes the client side signal processor, the output speed controller, the system switch, the output processor, the clock frequency controller, and the frequency adjustment range calculator, and
the main board includes a part of the reception side clock generator,
wherein each of the line processor and the client signal processor is implemented by:
i) computer executable instructions executed by at least one processor,
ii) at least one circuitry or
iii) a combination of computer executable instructions executed by at least one processor and at least one circuitry.

4. The transmission apparatus according to claim 2, comprising:
the client signal processor having a redundant configuration.

5. The transmission apparatus according to claim 1,
wherein the system switch measures a delay difference between the first signal and the second signal, and
the frequency adjustment range calculator calculates the adjustment range for eliminating the delay difference within a maintenance operation time based on the measured delay difference and the input maintenance operation time.

6. The transmission apparatus according to claim 1, further comprising:
a system switching controller configured to select any one of a system of the first transmission line and a system of the second transmission line and instruct the system switch to select the first signal or the second signal received in the selected system,
wherein the clock frequency controller includes:
a frequency divider configured to divide the clock signal giving a processing timing to the output processor and adjust a frequency; and
a clock adjuster configured to control a frequency division ratio, the frequency divider using the frequency division ratio for frequency division,
wherein each of the system switching controller and the clock adjuster is implemented by:
i) computer executable instructions executed by at least one processor,
ii) at least one circuitry or
iii) a combination of computer executable instructions executed by at least one processor and at least one circuitry.

7. The transmission apparatus according to claim 1, wherein the clock frequency controller is configured to adjust the frequency of the clock signal so as to align a reading speed of a buffer in which the first signal is buffered with a phase.

8. A transmission system comprising a transmission apparatus on the transmission side and a transmission apparatus on the reception side connected by a first transmission line and a second transmission line,
wherein the transmission apparatus on the transmission side includes
a transmission processor that performs a process of transmitting a first signal transmitted via the first transmission line and a process of transmitting a second signal having the same content as the first signal transmitted on the second transmission line; and
a transmission side clock generator configured to output a transmission side clock signal giving a processing timing to the transmission process, and
the transmission apparatus on the reception side includes
a first reception processor configured to receive the first signal transmitted on the first transmission line and perform a reception process on the first signal;
a second reception processor configured to receive the second signal transmitted on the second transmission line and perform a reception process on the second signal;
an output speed controller configured to control a speed at which the first signal on which the first reception processor has performed the reception process is output and a speed at which the second signal on which the second reception processor has performed the reception process is output;
a system switch configured to select and output any one of the first signal output by the first reception processor and the second signal output by the second reception processor;
an output processor configured to perform an output process for outputting the first signal or the second signal output by the system switch to another apparatus;
a reception side clock generator configured to output a reception side clock signal giving a processing timing to each of the first reception processor, the second reception processor, and the output processor;
a clock frequency control unit controller configured to adjust a frequency of the reception side clock signal giving the processing timing to the output processor; and
a frequency adjustment range calculator configured to calculate an adjustment range of the frequency at the clock frequency controller based on frequency deviation accuracy of the reception side clock generator, frequency deviation accuracy of the transmission side clock generator, and a prescribed value of a frequency deviation,
wherein the frequency adjustment range calculator is configured to
acquire the frequency deviation accuracy of the reception side clock generator measured at the transmission apparatus on the reception side and the frequency deviation accuracy of the transmission side clock generator measured at the transmission apparatus on the transmission side,
calculate a maximum value of a positive direction of the adjustment range by decreasing a maximum value of the acquired frequency deviation from a minimum value of a positive direction of the prescribed value of the frequency deviation, and calculate a maximum value of a negative direction of the adjustment range by decreasing a minimum value of the acquired frequency deviation from a minimum value of a negative direction of the prescribed value of the frequency deviation, and wherein each of the transmission processor, the transmission side clock generator, the first reception processor, the second reception processor, the output speed controller, the system switch, the output processor, the reception side clock generator, the clock frequency controller, and the frequency adjustment range calculator is implemented by:

i) computer executable instructions executed by at least one processor,
ii) at least one circuitry or
iii) a combination of computer executable instructions executed by at least one processor and at least one circuitry.

\* \* \* \* \*